(12) United States Patent
Brubaker

(10) Patent No.: US 7,414,561 B1
(45) Date of Patent: Aug. 19, 2008

(54) GRADIENT INSENSITIVE SPLIT-CORE DIGITAL TO ANALOG CONVERTER

(75) Inventor: James Lee Brubaker, Milpitas, CA (US)

(73) Assignee: Linear Technology Corporation, Milpitas, CA (US)

( * ) Notice: Subject to any disclaimer, the term of this patent is extended or adjusted under 35 U.S.C. 154(b) by 16 days.

(21) Appl. No.: 11/704,441

(22) Filed: Feb. 8, 2007

Related U.S. Application Data

(63) Continuation-in-part of application No. 11/487,143, filed on Jul. 13, 2006, which is a continuation of application No. 11/284,619, filed on Nov. 21, 2005, now abandoned, which is a continuation of application No. 11/101,944, filed on Apr. 8, 2005, now abandoned, which is a continuation of application No. 10/440,080, filed on May 15, 2003, now Pat. No. 6,937,178.

(51) Int. Cl.
*H03M 1/68* (2006.01)
(52) U.S. Cl. ........................................ 341/145; 341/154
(58) Field of Classification Search ................. 341/144, 341/145, 154
See application file for complete search history.

(56) References Cited

U.S. PATENT DOCUMENTS

| 4,338,591 | A | * | 7/1982 | Tuthill | 341/145 |
|---|---|---|---|---|---|
| 5,014,054 | A | * | 5/1991 | Oshita et al. | 341/145 |
| 5,343,199 | A | * | 8/1994 | Sugawa | 341/144 |
| 5,396,245 | A | * | 3/1995 | Rempfer | 341/145 |
| 5,859,606 | A | * | 1/1999 | Schrader et al. | 341/144 |
| 6,246,351 | B1 | * | 6/2001 | Yilmaz | 341/145 |
| 6,448,916 | B1 | * | 9/2002 | Leung | 341/144 |
| 6,710,730 | B2 | * | 3/2004 | Harada et al. | 341/154 |

* cited by examiner

*Primary Examiner*—Howard Williams
(74) *Attorney, Agent, or Firm*—McDermott Will & Emery LLP

(57) ABSTRACT

Digital to analog converter circuits and methods are provided for producing an analog output voltage indicative of a digital input signal with at least partial insensitivity to error gradients. Described are split-core resistive elements, which include a plurality of one-dimensional or multi-dimensional resistive strings, that may be used to reduce or substantially eliminate the effects that error gradients have on the linearity of the analog output voltages of a resistive string or interpolating amplifier DACs. The resistor strings that make up the split-core resistive elements are configured in such a manner that combining respective output voltages from each of the resistor strings results in an analog output voltage that is at least partially insensitive to the effects of error gradients.

32 Claims, 17 Drawing Sheets

GRADIENT INSENSITIVE SPLIT-CORE DIGITAL TO ANALOG CONVERTER

REFERENCE TO RELATED APPLICATIONS

This application is a continuation-in-part of U.S. patent application Ser. No. 11/487,143, filed Jul. 13, 2006, which is a continuation of U.S. patent application Ser. No. 11/284,619, filed Nov. 21, 2005, now abandoned which is a continuation of U.S. patent application Ser. No. 11/101,944, filed Apr. 8, 2005, now abandoned which is a continuation of U.S. patent application Ser. No. 10/440,080, filed May 15, 2003, which issued as U.S. Pat. No. 6,937,178 on Aug. 30, 2005, the entireties of which are incorporated herein by reference.

BACKGROUND OF THE INVENTION

The present invention relates to digital to analog converters (DACs). More particularly, this invention relates to circuits and methods for providing a split-core DAC that is at least partially insensitive to the effects of error gradients.

The general purpose of a DAC is to transform digital input signals into analog output voltages. In other words, a DAC takes the binary bits of a digital input signal, which originate from a computer or other type of discrete circuitry, and converts the digital input signal into an analog output voltage that can be used to drive analog devices (e.g., motor controllers or audio circuitry).

There are several types of DACs that are well known and are capable of converting digital input signals into analog output voltages. An example of a commonly used DAC is the binary-weighted resistor DAC, which uses N binary-weighted resistors (where N is the number of bits of a digital signal to be converted). This type of DAC is logically simple to implement, however, it is typically not the most practical type of converter to use because the range of resistor values often becomes very large. In particular, accurate resistors across the range of resistor values become difficult to fabricate as the resolution of the binary-weighted resistor DAC increases (i.e., as N increases).

Another commonly used DAC is the R-2R resistor ladder DAC. The R-2R resistor ladder DAC uses an R-2R ladder to produce the currents that are inputted into a summing amplifier. Unlike the binary-weighted resistor DAC, however, the range of resistor values used in an R-2R ladder DAC is not a function of the DAC's resolution. Therefore, unlike with the binary-weighted resistor DAC, the problem of often requiring a large range of resistor values is not present. The R-2R ladder DAC, however, does not guarantee monotonicity, which may be particularly important in applications such as control systems. In other words, as the digital input signal to be converted increases in value, the analog output voltage is not guaranteed to also increase. Similarly, a decrease in the digital input signal does not guarantee a decrease in the analog output voltage of the R-2R ladder DAC.

A third type of commonly used DAC, which relates more specifically to the present invention and is explained in greater detail below, is the resistor string DAC. The resistor string DAC uses a resistor string (voltage divider) network to generate a set of analog output voltages through sequential voltage taps. Moreover, resistor string DACs use one of the simplest architectures, utilizing a string of ideally identical resistors connected in series between two reference voltages (e.g., a DAC reference voltage, Vref, and ground).

The resistor string of a resistor string DAC includes $2^N$ series connected resistors, where again, N represents the resolution of the DAC, or the number of bits in the digital input signal to be converted. Assuming identical resistors, the resistor string divides the reference voltage, Vref, into $2^N$ equally spaced voltages. The junctions (or nodes) in between each pair of connected resistors provide voltage taps through, for example, controlled switches corresponding to particular digital input signals. The respective voltage levels of these voltage taps vary according to their location relative to the reference voltages (e.g., Vref and ground).

The analog output voltage in a resistor string DAC is obtained by using one or more switches to connect the selected voltage tap to the DAC output. Persons skilled in the art will appreciate that the number of switches necessary to provide the analog output voltage depends on the type of decoder being utilized. The switches of a resistor string DAC can be controlled, for example, using an N:$2^N$ decoder that uses the binary bits of the digital signal to select one of $2^N$ available switches to be closed, allowing the desired voltage level to be passed, or transmitted, as the analog output voltage of the resistor string DAC. Other types of decoders, however, may also be used that require, for example, greater than $2^N$ switches. For example, a tree decoder may be used, in which case arranging the switches into a binary tree structure would provide inherent decoding using only the digital input signal.

Aside from simplicity in design, another major benefit associated with using resistor string DACs as opposed to other types of DACs is that resistor string DACs are intrinsically monotonic (as long as the switching elements are functioning properly). Accordingly, an increase in the digital input signal results in an increased analog output voltage, while a decrease in the digital signal results in a decreased analog output voltage.

A significant drawback associated with using resistor string DACs, however, is that the linearity of the analog output voltages corresponding to different digital input signals is limited by the precision with which the voltage division is accomplished. As the resolution of the resistor string DAC increases, the number of resistors increases exponentially, increasing the likelihood that the resistors being used will have reduced precision. Moreover, as the number of binary bits in the digital signal increases, the quantization step size decreases for any given reference voltage being used. Accordingly, the voltage taps provided by the resistor string of the resistor string DAC become much closer as the resolution of the DAC increases, thus increasing the requirements for accurately matched resistors.

Accurate resistor matching can also be a problem in another type of DAC, the interpolating amplifier DAC, which operates using the principle of a segmented DAC and is explained in greater detail below. Because interpolating amplifier DACs may also utilize resistor strings in order to provide voltage taps (for providing analog output voltages), the accuracy associated with the resistor matching in the resistor string or strings being used affects the quality (e.g., linearity) of the analog output voltages.

Due to various technological limitations, the matching of the resistor string resistors for larger resolution DACs becomes extremely difficult. One factor that limits the resistor matching, and therefore the accuracy of voltage division by the resistor string, is the introduction of error gradients (e.g., linear error gradients). Persons skilled in the art will appreciate that the phrase "error gradients" used herein may refer to a single error gradient, or a plurality of error gradients that produce deviations in resistor values as described below.

Fabrication time linear error gradients may be introduced, for example, during the resistive network fabrication process. These linear error gradients, which in some instances are the result of imperfect processing during the fabrication of resistors, may be due to a number of different factors. For example, the imperfect processing of resistors may be due in part to variations in either the doping density or fabricated resistor widths, or both. Additional factors which may lead to the introduction of linear error gradients include, for example, variations in the resistor lengths as determined by contact openings and the thickness of the resistive material layer. Accordingly, variations in the sheet resistance and geometry of the resistive materials cause imperfections during the fabrication of resistors. Moreover, variations in contact resistance may also contribute to the introduction of linear error gradients.

Linear error gradients may also be introduced at some point other than the resistive network fabrication process. For example, resistors used in resistor string DACs or interpolating amplifier DACs may be subject to thermal linear error gradients. In this case, variations in the temperature conditions surrounding the various resistors of a resistor string may result in the resistors being subject to undesirable deviations in resistor values.

In view of the foregoing, it would be desirable to provide various resistor string and interpolating amplifier DACs that are at least partially insensitive to the effects of error gradients.

SUMMARY OF THE INVENTION

It is therefore an object of the present invention to provide resistor string and interpolating amplifier DACs that are at least partially insensitive (i.e., that have at least reduced sensitivity) to error gradients such as the types of linear error gradients described above.

In accordance with this and other objects of the present invention, DAC circuitry and methods which provide digital to analog conversion with reduced sensitivity or substantial insensitivity to error gradients are provided. Split-core resistive elements are described that may be used in DAC circuitry to offset the effects of error gradients on the linearity of the available analog output voltages corresponding to various digital input signals. For example, the split-core resistive elements in accordance with the principles of the present invention include at least two resistor strings that may be configured such that a common centroid exists with respect to the error gradients. Accordingly, a plurality of resistor string output voltages may be combined in order to at least partially cancel the effects of the error gradients.

The principles of the present invention, moreover, can be applied to any suitable type of DAC, for example, a conventional resistor string DAC, segmented DAC or interpolating amplifier DAC. Examples of conventional DAC structures are Linear Technology Corp.'s LTC1257 and LTC1660 series products, which are described and claimed in commonly owned U.S. Pat. Nos. 5,396,245 and 5,859,606, and are hereby incorporated by reference herein in their entirety.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

This invention relates to DACs that are substantially insensitive or have at least reduced sensitivity to the effects of error gradients. More particularly, various embodiments of resistor string DACs and interpolating amplifier DACs having at least partial insensitivity to error gradients are described below in accordance with the principles of the present invention.

To better understand the detrimental effects that error gradients have on the performance of a DAC, and how the present invention compensates for such effects, conventional resistor string and interpolating amplifier DACs will first be explained.

Figure 1:
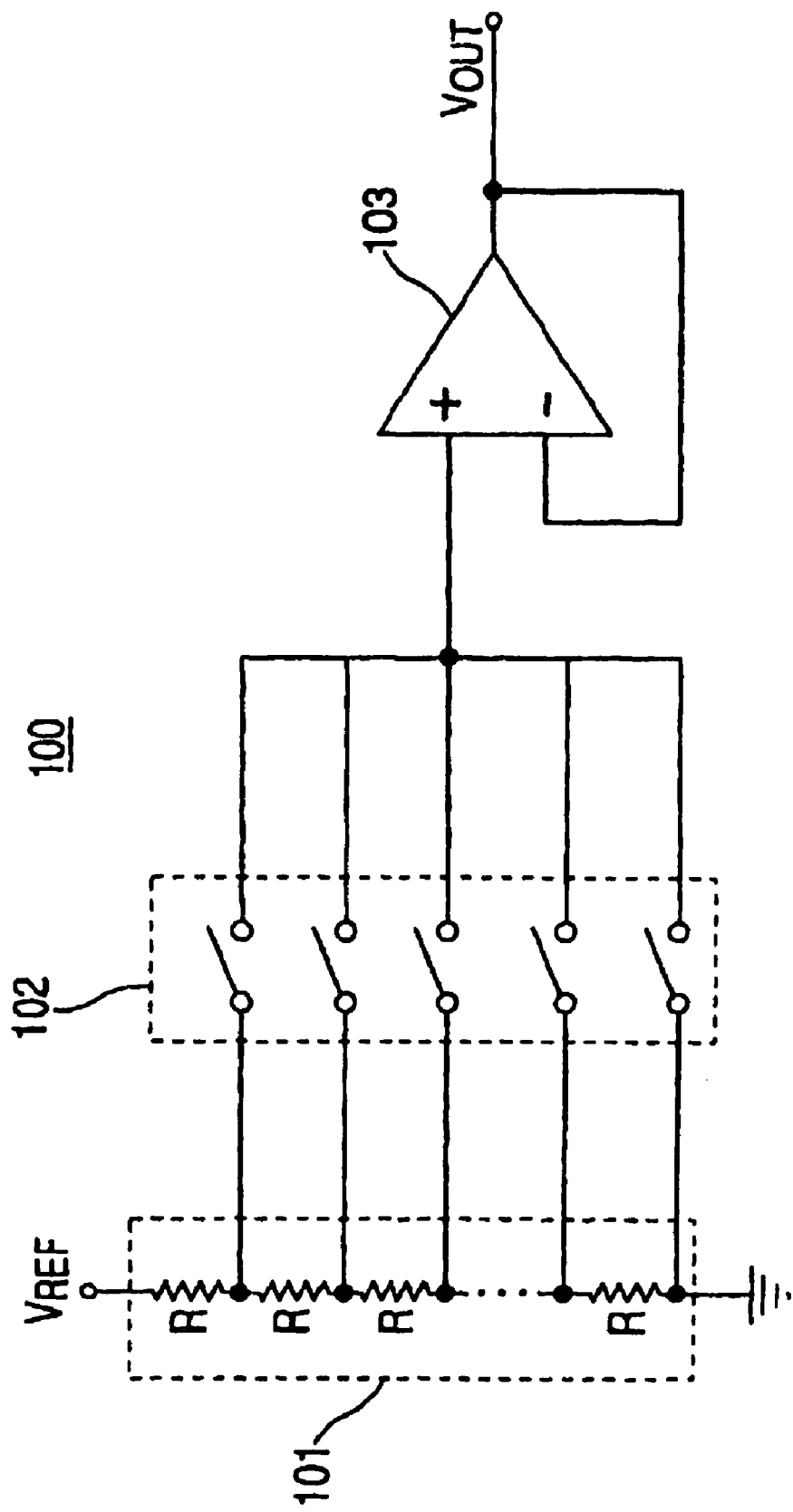
FIG. 1 is a schematic diagram of a conventional resistor string DAC.

A conventional resistor string DAC 100 that may be subject to the effects of linear error gradients is shown in FIG. 1. DAC 100 includes resistor string 101, which includes $2^N$ ideally identical resistors (e.g., each resistor of resistor string 101 has a resistance as close to R as possible). The nodes between successive series connected resistors are coupled, through switching bank 102 (which includes $2^N$ switching elements, or switches), to the input of unity gain buffer amplifier 103. Persons skilled in the art will appreciate that, as used in the specification and claims hereof, a first element may be coupled to a second element even though the elements are not linked at the same node.

FIG. 1 illustrates resistor string 101 as including conventional resistors, and switching bank 102 as including simple switching devices. These circuit components (and the comparable components discussed below in connection with the remaining figures), however, can be implemented in any suitable manner. For example, although resistors and switches are referred to herein, persons skilled in the art will appreciate that the resistors of resistor string 101 can be any suitable type of resistive material available for use in an integrated circuit, and the switches can be metal-oxide semiconductor field effect transistor (MOSFET) switches, transmission gates, or any other suitable type of circuitry. Moreover, although the figures described herein illustrate switching banks that operate using utilize $N:2^N$ decoders (not shown), persons skilled in the art will also appreciate that the invention is not limited in this manner. For example, a tree decoder together with a switching bank including more switches than found in switching bank 102 may be used without departing from the scope of the present invention. Additionally, DAC 100 can be implemented with or without the inclusion of buffer amplifier 103 as shown in FIG. 1.

When resistor string 101 consists of identical resistors, the resistors of resistor string 101 divide a reference voltage, Vref, into $2^N$ equally spaced voltages (not including Vref). Persons skilled in the art will appreciate that, instead of using ground as a voltage tap for resistor string 101, Vref may be used. Alternatively, both Vref and ground may provide voltage taps, resulting in a total of $2^N+1$ voltage taps, or neither Vref or ground may be used, resulting in $2^N-1$ voltage taps. The invention is not limited in this manner.

At any given time, only one switch in bank 102 is closed (as determined by the digital input signal to DAC 100). The digital input signal, by controlling which switch is closed, thereby determines the voltage tap from resistor string 101 that is used to provide the analog output voltage of DAC 100. For example, a digital input signal corresponding to a decimal value of 0 results in the switch nearest to ground being closed (and thus an analog output voltage of 0 volts). Conversely, an input corresponding to the highest possible decimal value (e.g., for N=4, a binary input of 1111 corresponding to a decimal value of 15) results in the switch closest to Vref being closed, and thus an analog output voltage of Vref minus the voltage drop across the top resistor (i.e., the resistor closest to Vref in FIG. 1).

As explained above, any suitable type of decoder may be used to determine the proper switch to be closed (and therefore the output of buffer amplifier 103) in response to a given digital input signal. For example, an $N:2^N$ decoder, a tree decoder or any other suitable type of decoder may be used in DAC 100 or the other DACs described herein.

Moreover, persons skilled in the art will appreciate that, in many situations, DAC 100 may have an available reference voltage Vref that is undesirably high. To reduce reference voltage Vref to a more desirable reference voltage level DACREF, a divide down resistive element may be placed between Vref and the top resistor in resistor string 101. The divide down resistive element may include, for example, a single divide down resistor. Alternatively, for improved accuracy in producing a desired divide down ratio (e.g., the ratio of DACREF to Vref), the divide down resistive element may include a series connected string of resistors.

Figure 2:
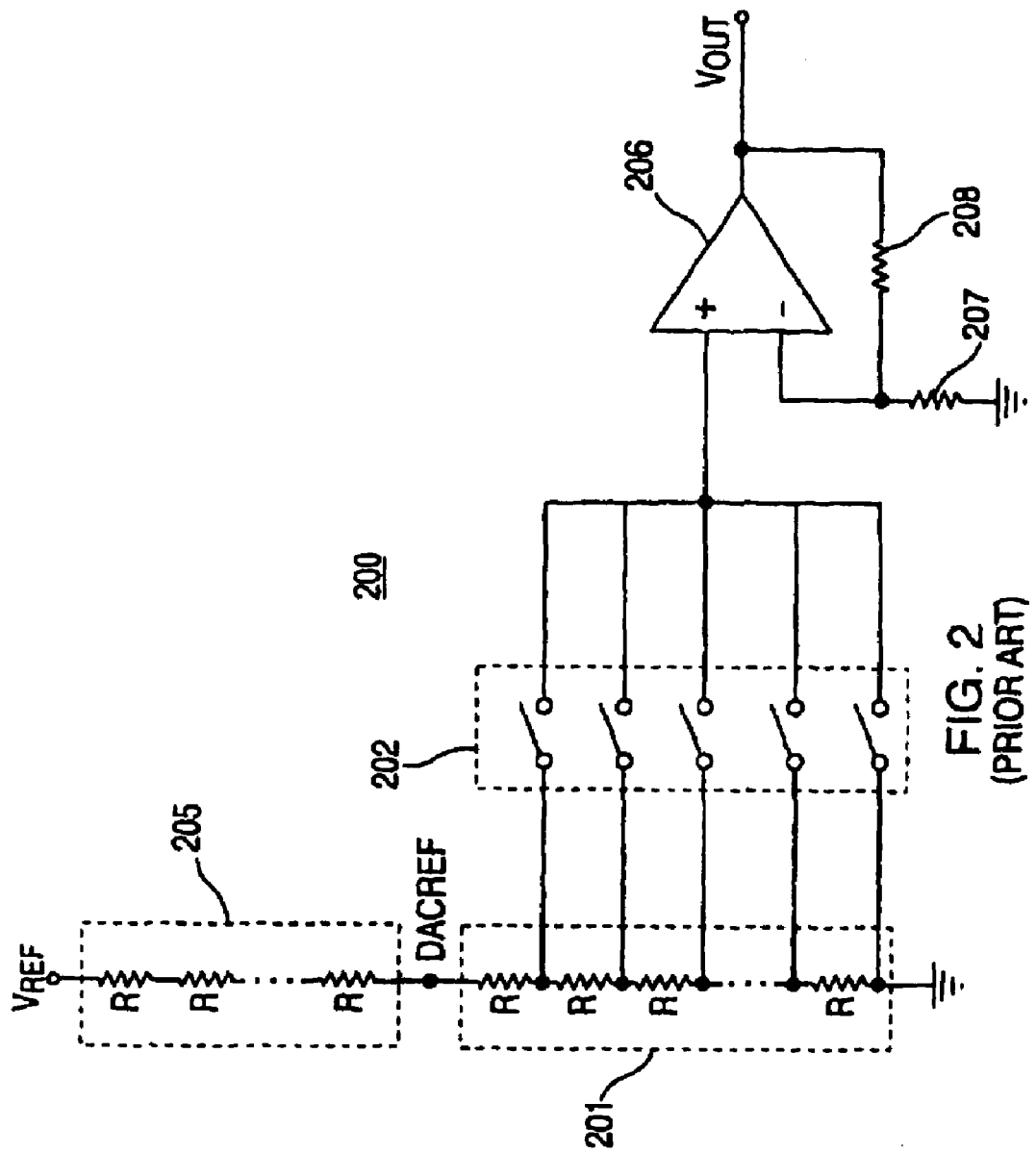
FIG. 2 is a schematic diagram of another conventional resistor string DAC that uses a divide down resistive element to allow selection of the DAC reference voltage.

FIG. 2 shows a conventional resistor string DAC 200 that reduces Vref to a desired voltage level with the use of a divide down resistive element 205, and similar to DAC 100, may be subject to the effects of error gradients. Ideally, each of the resistors in divide down resistive element 205 shown in FIG. 2 have a resistance identical to the resistors in resistor string 201, which as with the resistors in DAC 100, may be any suitable resistor value. The effect of including divide down resistive element 205 is that, assuming accurately matched resistors, the reference voltage for resistor string 201, DACREF, is reduced to a value of Vref multiplied by $2N/(2^N+X)$ (as calculated by using simple voltage division analysis, where X is the number of resistors in divide down resistive element 205). Moreover, although a single resistor may be used in divide down resistive element 205 as described above, using a plurality of resistors substantially identical to the resistors of resistor string 201 enables more accurate ratio matching and therefore a more accurate selection of the divide down ratio between Vref and DACREF.

In addition to the inclusion of divide down resistive element 205, DAC 200 also differs from DAC 100 because, instead of providing the DAC output through the use of a buffer amplifier (e.g., buffer amplifier 103 shown in FIG. 1), DAC 200 uses non-inverting amplifier 206 and feedback resistors R1 207 and R2 208 to provide an analog output voltage. In this manner, the analog output voltage of DAC 200 for a given digital input signal can be varied by adjusting the values of resistors R1 207 and R2 208. Namely, the analog output voltage of amplifier 206 will have a value equal to the analog input voltage of amplifier 206 (which depends on the digital input signal) multiplied by $(1+(R2/R1))$.

A conventional interpolating amplifier DAC 300 that may also be subject to the effects of error gradients, such as linear error gradients as described above, is shown in FIG. 3. Interpolating amplifier DAC 300, when compared to DACs 100 or 200, has a significantly reduced number of required resistors and switches. Moreover, like resistor string DACs 100 and 200, DAC 300 has the benefit of guaranteed monotonicity regardless of errors associated with the voltage taps of resistor string 301.

Figure 3:
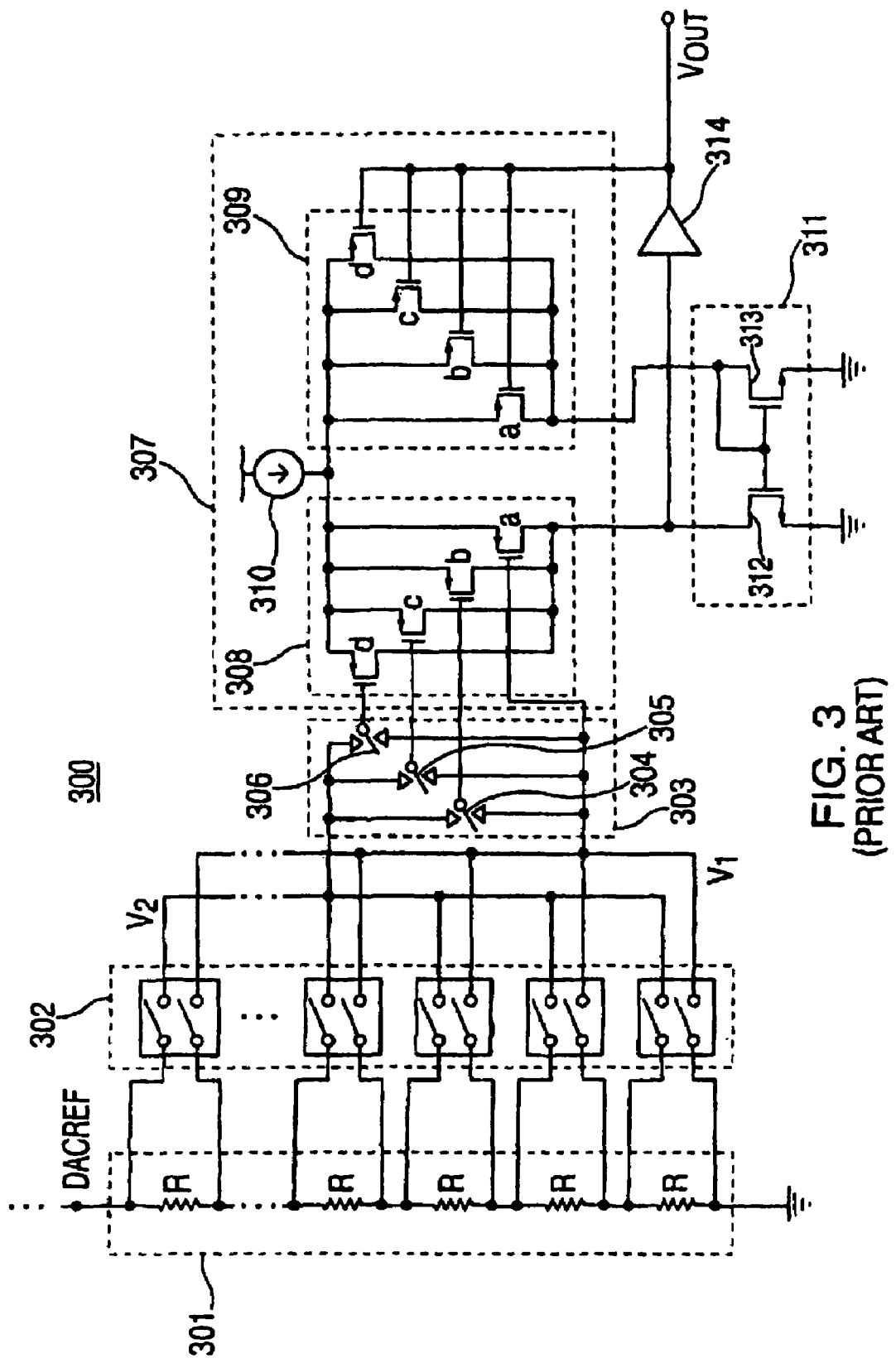
FIG. 3 is a schematic diagram of a conventional interpolating amplifier DAC.

Interpolating amplifier DACs, such as DAC 300 shown in FIG. 3, operate using the principle of a segmented DAC. The digital input signal being used to produce an analog output voltage is split into two subwords, a most significant (MS) digital subword and a least significant (LS) digital subword. Through the use of a circuit such as shown in FIG. 3, it becomes possible to produce analog output voltages corresponding not only to the voltage levels obtained from the voltage division taking place in the resistor string, but intermediate voltage levels as well.

The LS digital subword for the interpolating amplifier DAC shown in FIG. 3 has a length, L, equal to 2. This length has been chosen for the purpose of simplifying the description of DAC 300, although DAC 300 can be implemented with any value of L as well as any value of M, the length of the MS digital subword.

Moreover, in additional to resistor string 301, DAC 300 includes switching banks 302 and 303, and a single differential transconductance stage (DTS) 307, which is made up of composite PMOS transistors 308 and 309. Current source 310 feeds the source terminals of transistors 308 and 309, whose drains are respectively coupled to the drains of NMOS transistors 312 and 313, which constitute current mirror 311. The drain of transistor 312 is also coupled to the input of high-gain inverting amplifier 314, the output of which supplies the analog output voltage and is fed back to the subtransistor gates of composite transistor 309.

Resistor string 301 and switching device bank 302 are arranged in FIG. 3 to provide a pair of voltage taps for any given digital input signal. Switching bank 302 is controlled by the MS digital subword to provide output voltages $V_1=k_m*DACREF/2^M$ and $V_2=(k_M+1)*DACREF/2^M$, where $k_M$ refers to the decimal equivalent of the MS digital subword.

Persons skilled in the art will appreciate that, in accordance with the principles of the present invention, any suitable type of decoding may be used to determine the proper pair of switches in switching bank 302 to be closed.

To interpolate a voltage level between $V_1$ and $V_2$, switching bank 303 and DTS 307 are used. Switching bank 303 is controlled by the LS digital subword such that $k_L$ (the decimal equivalent of the LS digital subword) of switches 304, 305 and 306 of switching device 303 are switched to their alternate positions (i.e., coupled to $V_2$) and $2^L$-$k_L$ switching devices remain in their normal positions (i.e., coupled to $V_1$).

Assuming equal geometries for each of the subtransistors of composite transistors 308 and 309 in DTS 307, all of the sub-differential pairs in DTS 307 will have substantially equal transconductances. Namely, sub-differential pairs 308a-309a through 308d-309d will each have a transconductance equal to $\frac{1}{2^L}$ times the transconductance of the composite differential pair 308-309.

Accordingly, the MS digital subword selects the voltage taps $V_1$ and $V_2$ while the LS digital subword determines at what voltage level between $V_1$ and $V_2$ the analog output voltage of DAC 300 will be. When the LS subword is zero, all subtransistor gates of composite transistor 308 are coupled to $V_1$ and Vout is substantially equal to $V_1$. Therefore, Vout is substantially equal to $k_M * DACREF/2^M$. Incrementing the LS subword by one causes switching bank 303 to switch one subtransistor gate of composite transistor 308 from $V_1$ to $V_2$, leaving the remaining $2^L-1$ coupled to $V_1$. In this scenario, Vout is substantially equal to $V_1$ plus $(V_2-V_1)/2^L$. Similarly, as each subsequent sub-transistor gate is switched from $V_1$ to $V_2$, Vout will move from $V_1$ towards $V_2$ by an amount of $(V_2-V_1)/2^L$.

Once all of the subtransistor gates of composite transistor 308 are switched to $V_2$ (except for 308a which does not switch to $V_2$), Vout is one increment below $V_2$. The next DAC output level ($V_2$) can be reached by setting the digital subword so that $k_L$ is zero, thereby returning all of the subtransistor gates of composite transistor 308 to their normal positions, and increasing the MS digital subword by one. In doing so, switch bank 302 moves voltage taps $V_1$ and $V_2$ up on string 301, setting the new level of $V_1$ equal to the previous level of $V_2$ and moving $V_2$ one tap higher on resistor string 301.

In the manner described above, DAC 300 provides an output voltage equal to the decimal equivalent of the digital input signal times $DACREF/2^N$. In doing so, DAC 300 provides substantially the same output levels as the aforementioned non-interpolating DAC structures, but requires exponentially fewer resistors and switches. Similar to other DACs, however, the introduction of error gradients in the resistors of resistor string 301 may cause undesirable inaccuracies.

Figure 4:
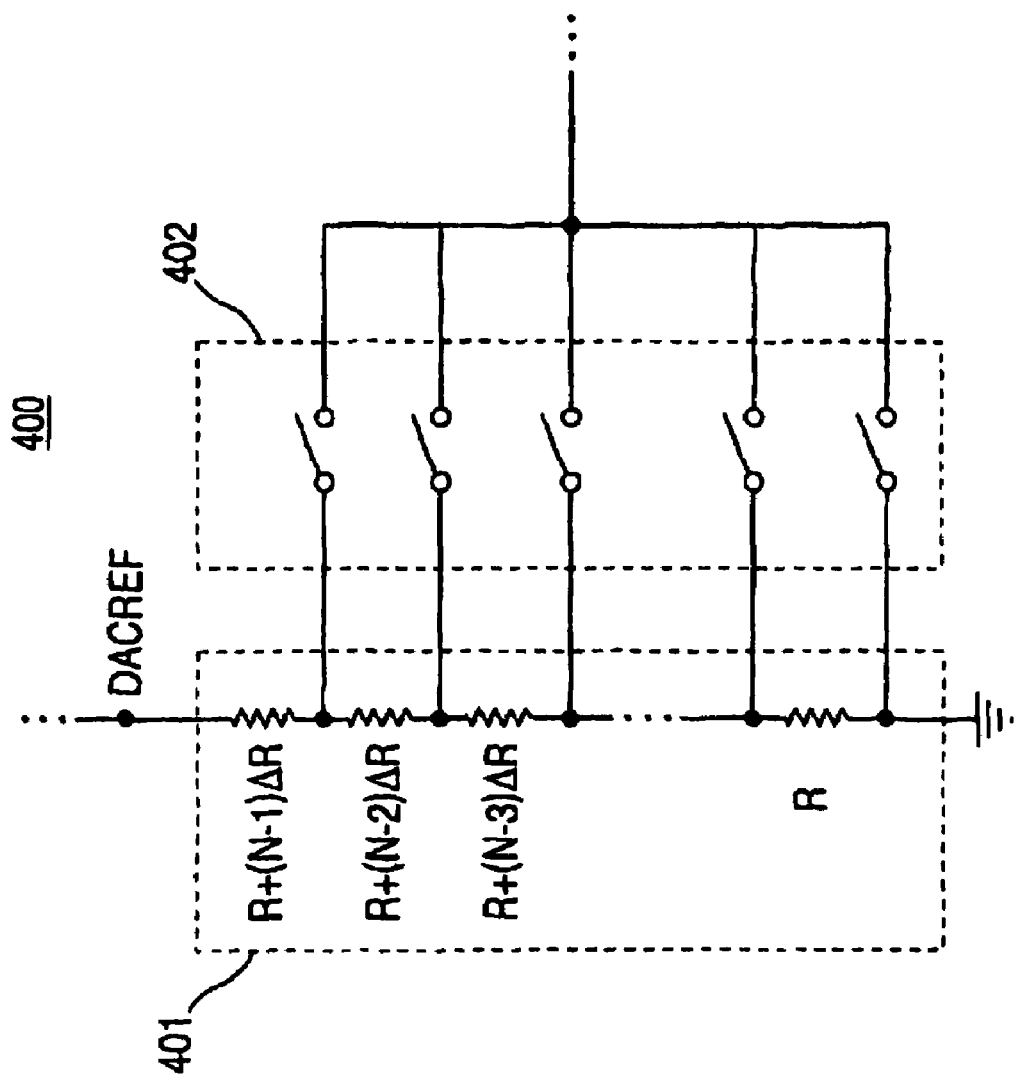
FIG. 4 is a schematic diagram of a portion of a resistor string DAC which models resistor mismatch due to the presence of linear error gradients.

Representative effects associated with error gradients are illustrated in FIG. 4. DAC 400, which shows a portion of a DAC having N resistors, includes a resistor string 401 that is affected by linear error gradients, and switching bank 402 that is similar to the switching banks described above. The result of the linear error gradients, as modeled by deviations in the resistance values of the various resistors in resistor string 401, is resistor mismatch. These linear error gradients are due to, for example, imperfect processing of integrated circuits. Moreover, while the effects of linear error gradients on resistor values is illustrated in FIG. 4, it will be appreciated by persons skilled in the art that the principles of the present invention may be applied to linear or nonlinear error gradients.

Persons skilled in the art will also appreciate that the type of resistor mismatch illustrated in FIG. 4, resulting from linear error gradients, can be present in resistor strings made up of either a one-dimensional or multi-dimensional configuration of resistors. In the case of a resistor layout that includes two-dimensional resistor strings, for example, the deviations of resistor values bears a linear relationship to the relative positioning of a given resistor with regards to both dimensional axes along which the resistors are configured. Accordingly, the deviation in the resistance value of a resistor can be expressed as a linear function of the resistor's positioning away from a center point with regards to two dimensional axes.

Consequently, a common center, or common centroid, exists about which point the effects of linear error gradients on resistor values are opposite while traversing contrary directions. In other words, repeatedly averaging the values of any two resistors equidistantly spaced apart (in opposite direction) from the common centroid with respect to the linear error gradients would result in obtaining a substantially constant resistance value. With regards to nonlinear error gradients, to which the principals of the present invention may also be applied, persons skilled in the art will appreciate that the averaging described above, while not resulting in a single resistance value as when dealing with linear error gradients, results in resistance values that are at least closer to a uniform value than without any such averaging.

Figure 5A:
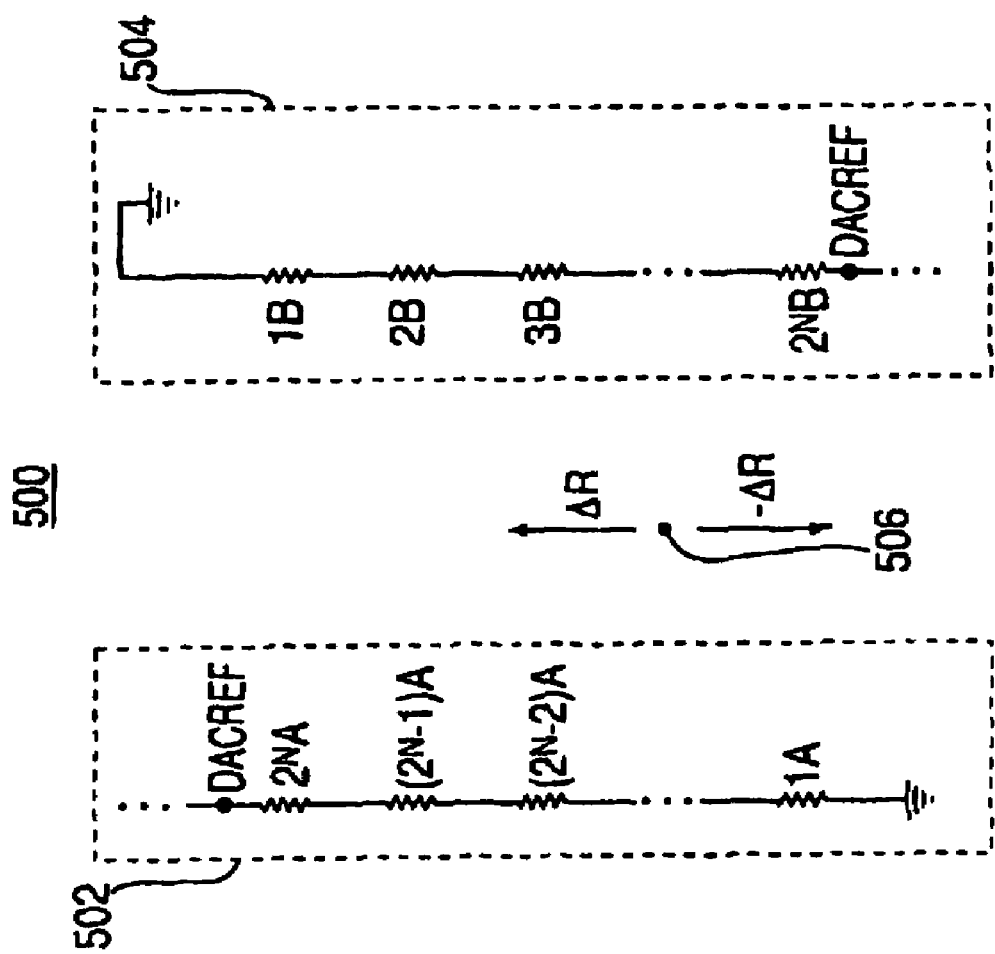
FIG. 5A is a circuit diagram of a one-dimensional resistor layout in accordance with the principles of the present invention.

FIG. 5A shows the physical arrangement of resistors on a resistor layout 500 which includes a pair of one-dimensional resistor strings 502 and 504 in accordance with the principles of the present invention. Resistor layout 500 may be used as explained below, for example, to substantially eliminate or at least reduce the effects of error gradients on the analog output voltages of a resistor string DAC. As illustrated in FIG. 5A, resistor strings 502 and 504 are configured such that corresponding resistors (e.g., resistor 1A and 1B) are spaced substantially equidistant and oppositely from common centroid 506. Therefore, combining corresponding voltage taps from resistor strings 502 and 504 (e.g., the voltages following the $i^{th}$ resistors from ground) provides an analog output voltage with minimal or substantially no effects due to linear error gradients.

Figure 5B:
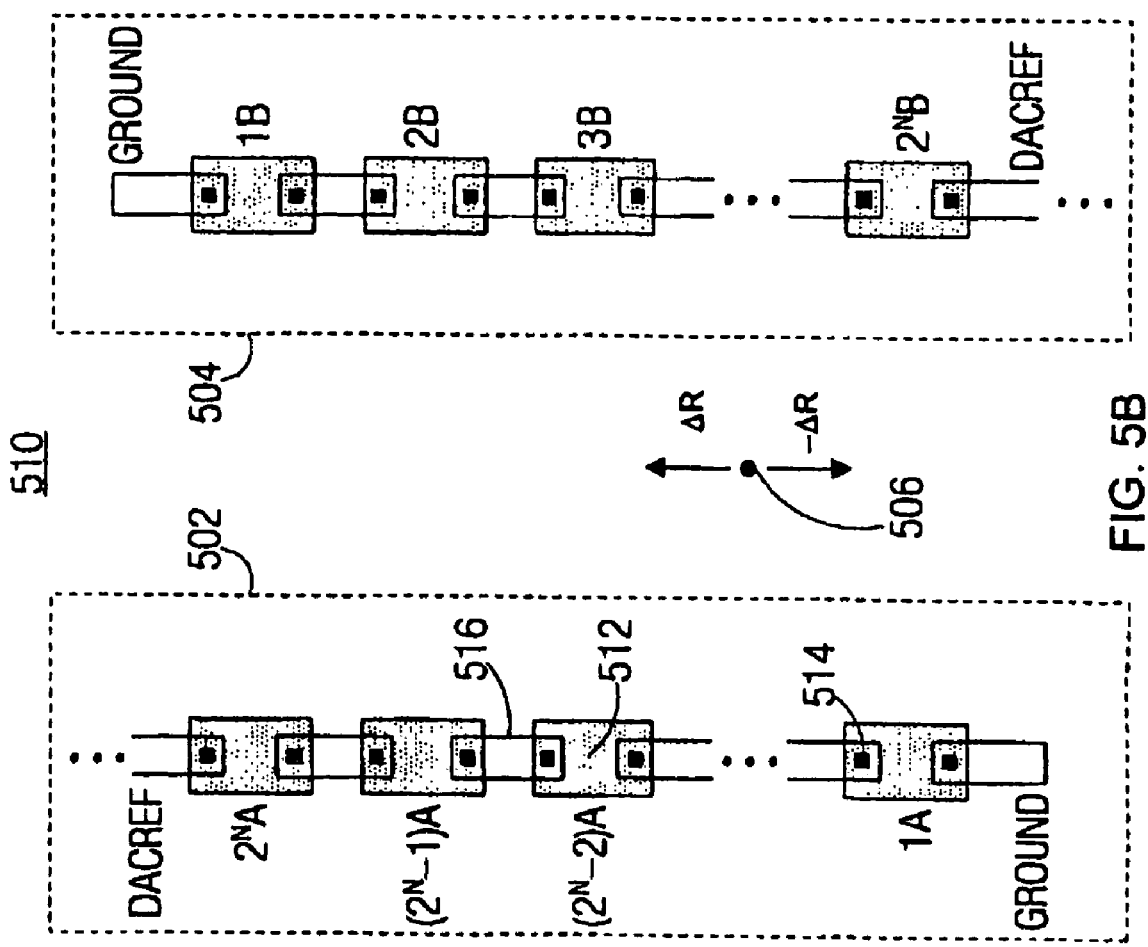
FIG. 5B is a more detailed circuit diagram of the one-dimensional resistor layout of FIG. 5A.

The resistor layout 500 of FIG. 5A is shown in more detail in FIG. 5B. As illustrated in FIG. 5B, the resistors of resistor strings 502 and 504 may be poly-silicon resistors 512. The invention, however, is not limited in this manner. Moreover, the resistor contacts 514 of each of the resistors in resistor strings 502 and 504 may be coupled by standard metal interconnects 516. Metal interconnects 516 may also be used, as illustrated in FIG. 5B, to electrically couple resistor $2^N$A of resistor string 502 and resistor $2^N$B of resistor string 504 to DACREF, and to electrically couple resistor 1A of resistor string 502 and resistor 1B of resistor string 504 to GROUND.

Figure 5C:
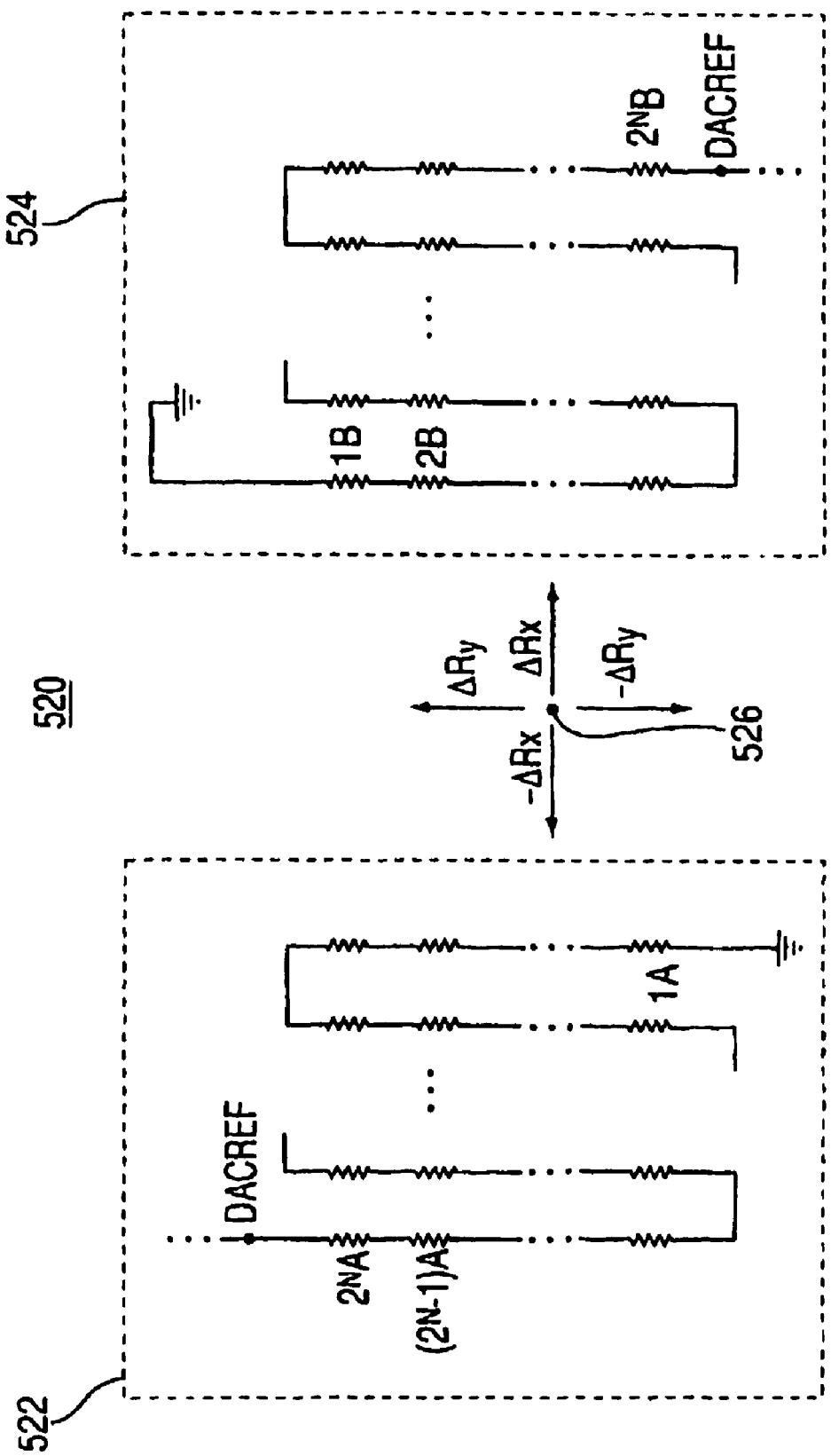
FIG. 5C is a circuit diagram of a two-dimensional resistor layout in accordance with the principles of the present invention.

FIG. 5C, meanwhile, shows another physical arrangement of resistors on a resistor layout 520 in accordance with the principles of the present invention which includes a pair of two-dimensional resistor strings 522 and 524. As with resistor layout 500, resistor layout 520 may be used, for example, to offset the effects that error gradients normally have on the available analog output voltages of resistor string DACs (e.g., as a result of deviations in resistor values due to the error gradients). For example, as illustrated in FIG. 5C, resistor strings 522 and 524 are configured such that corresponding resistors (e.g., resistors 1A and 1B) are spaced apart the same distance and in opposite directions from common centroid 526. Thus, combining corresponding voltage taps from resistor strings 522 and 524 (e.g., the voltages following the $i^{th}$ resistors from ground) provides an analog output voltage with reduced or substantially no sensitivity to the error gradients affecting resistor strings 522 and 524.

Figure 5D:
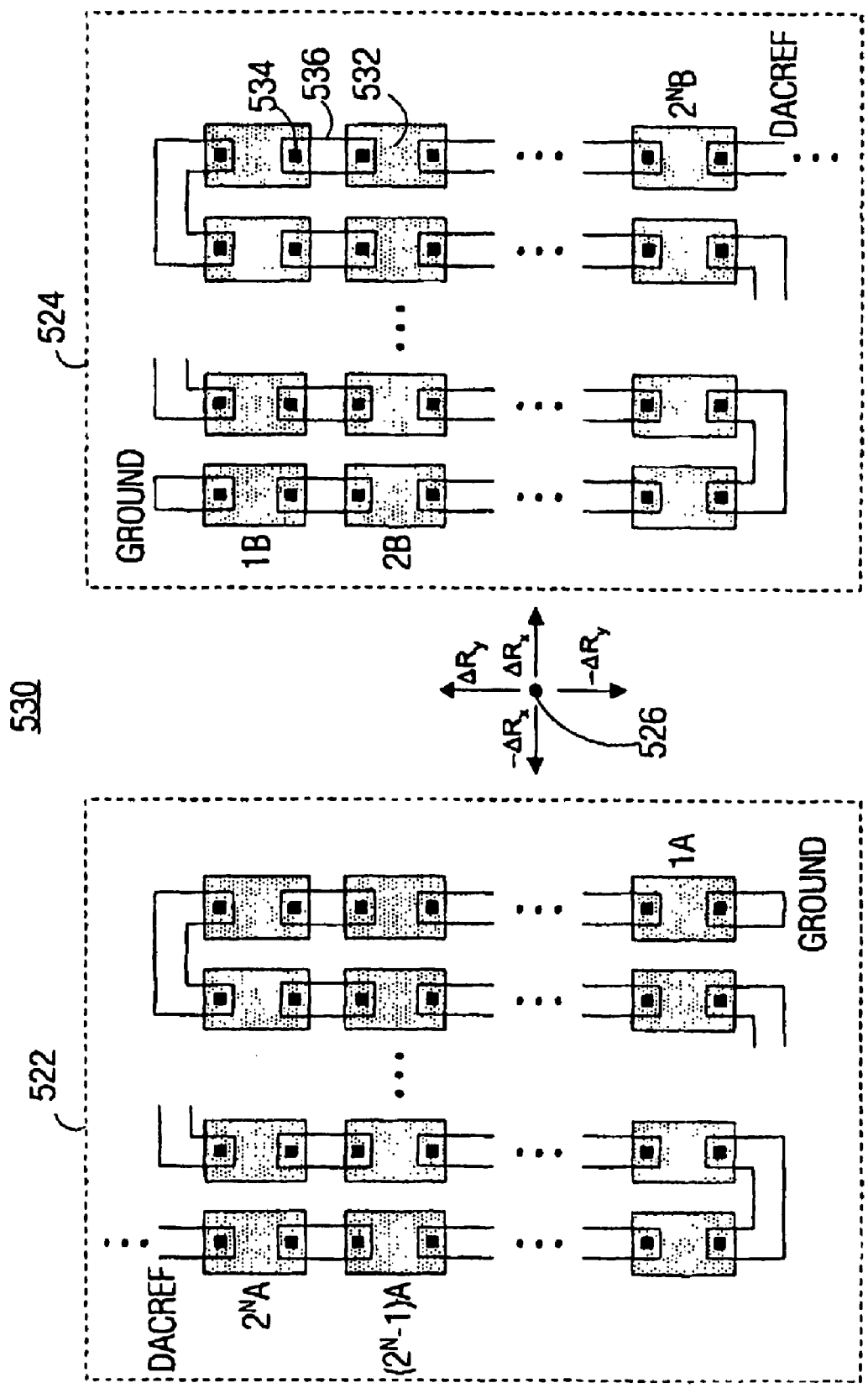
FIG. 5D is a more detailed circuit diagram of the two-dimensional resistor layout of FIG. 5C.

The resistor layout 520 of FIG. 5C is shown in more detail in FIG. 5D. As explained above in connection with resistor strings 502 and 504, the resistors of resistor strings 522 and 524 may be poly-silicon resistors 532 (although the invention is not limited in this manner). Moreover, the resistor contacts 534 of each of the resistors in resistor strings 522 and 524 may be coupled by standard metal interconnects 536. Metal interconnects 536 may also be used, for example, to electrically couple resistors $2^N$A and $2^N$B (of resistor strings 522 and 524, respectively) to DACREF, and to electrically couple resistors 1A and 1B (of resistor strings 522 and 524, respectively) to GROUND.

Persons skilled in the art will appreciate that any suitable method of row-column decoding may be used, in accordance with the principles of the present invention, with a split-core resistive element DAC (explained in detail below) using resistor layouts such as those shown in FIGS. 5A and 5C. Persons skilled in the art will also appreciate that although FIGS. 5A and 5C each show a specific layout of resistor strings that encompasses the notion of error gradient cancellation (or at least reduction of their effects), any other suitable resistor layout may be used in a split-core resistive element DAC in accordance with the principles of the present invention. For example, any resistor string layout that is configured in such a way as to contain a common centroid for the purpose of at least reducing the effects of error gradients may be used without departing from the scope of the present invention.

As will become more clear from the examples provided below, reduction or cancellation of the effects of error gradients, such as linear error gradients, using resistor layouts such as resistor layouts 500 or 520 described above is possible due to the respective configuration of resistors therein about common centroids 506 and 526 with respect to the effects of error gradients. In particular, the resistors of resistor layouts 500 and 520 are laid out in such a way that the linear error gradients, for example, cause resistors equally but oppositely spaced apart from common centroids 506 or 526 to have offsetting deviations in resistance value. Accordingly, combining the voltages following the $i^{th}$ resistor of each resistor string in either resistor layout 500 or 520, for example, results in the substantial cancellation of the effects of linear error gradients on the analog output voltage.

Persons skilled in the art will further appreciate that combining voltage taps other than those following resistors spaced exactly the same distance (and oppositely) from the common centroid, for example, may also be beneficial. In other words, combining the voltage taps following resistors 10A and 11B (not shown) in resistor layout 520 of FIG. 5C may be beneficial even if the effects of error gradients are not completely eliminated, because the effects of error gradients will at least be substantially reduced. The invention is not limited in this manner.

Figure 6:
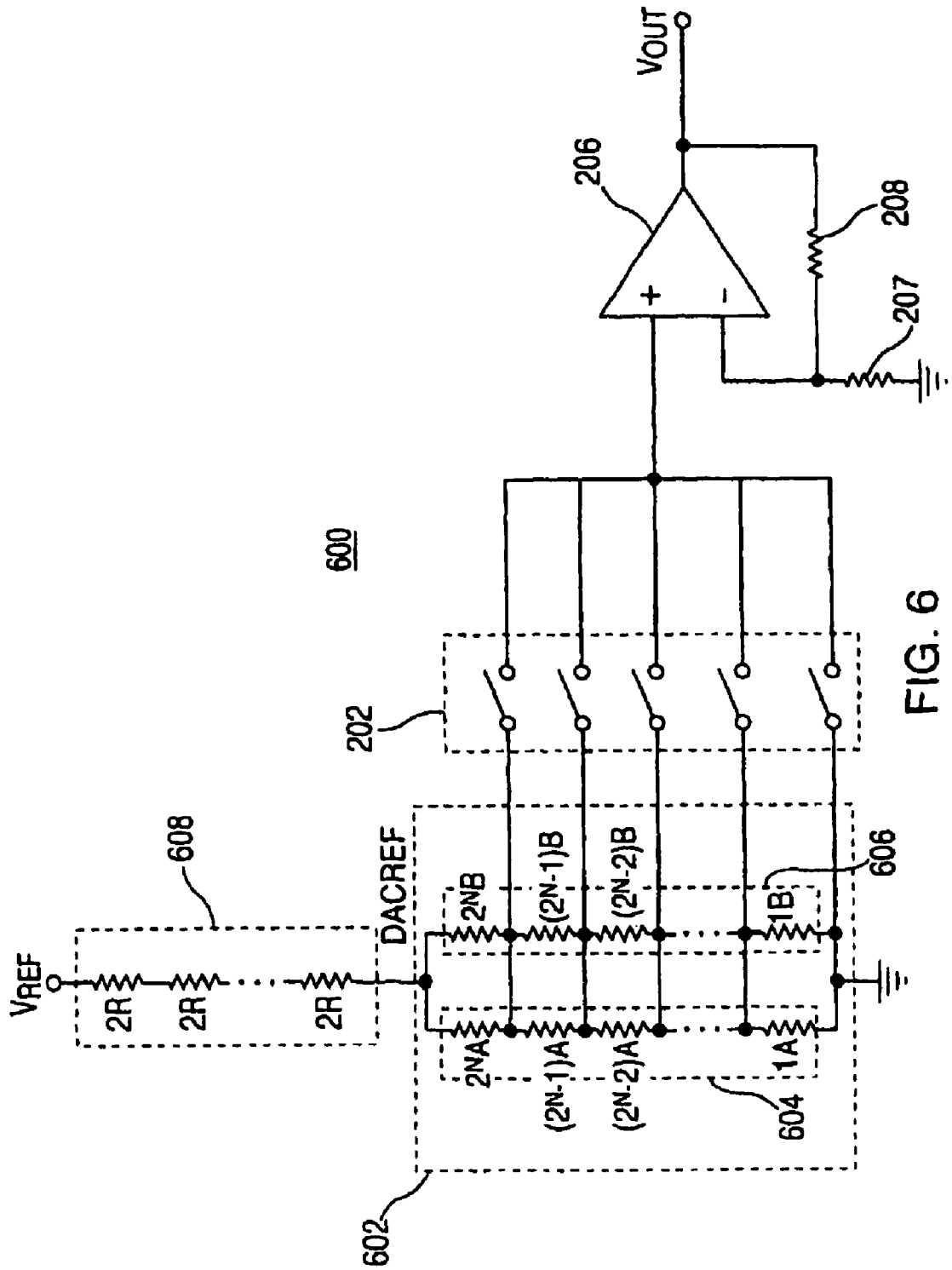
FIG. 6 is a schematic diagram of a resistor string DAC including a divide down resistive element in accordance with the principles of the present invention.

In accordance with the principles of the present invention, a resistor string DAC 600 is shown in FIG. 6 which reduces the effects of error gradients. DAC 600 is similar to DAC 200, except that DAC 600 includes a DAC resistive element 602 instead of a single resistor string 201. DAC resistive element 602, as shown in FIG. 6, includes two resistor strings 604 and 606 that are interconnected to form $2^N$ pairs of resistors connected in parallel.

In the case of linear error gradients, the resistors of DAC resistive element 602 (e.g., the resistors of resistor strings 604 and 606) are configured such that taking the average of the resistor values of the resistors connected in parallel provides a substantially constant value. This occurs when the physical layout of DAC resistive element 602 is such that the resistors of DAC resistive element 602 are substantially configured about a common centroid with respect to any linear error gradients (e.g., when the deviations in resistor values of the resistors from resistor strings 604 and 606 coupled in parallel are substantially complementary).

By coupling the resistors as illustrated in FIG. 6, the deviations in the resistive values and the effects on the analog output voltage of DAC 600 are at least partially offset. For example, assume that for DAC 600, N=2, DACREF is 4V and the resistors in resistor strings 604 and 606, in sequential order, have resistances of 1.00 kΩ, 1.01 kΩ, 1.02 kΩ and 1.03 kΩ. Lining up the resistor strings with opposite polarity (e.g., the effects of the linear error gradients being in opposite directions such as illustrated in resistor layout 500 of FIG. 5A) leads to DACREF being connected to the 1.00 kΩ resistor of resistor string 604 and the 1.04 kΩ resistor of resistor string 606. Accordingly, the parallel combinations would yield effective resistances of approximately 507.389Ω, 507.488Ω, 507.488Ω and 507.389Ω, from ground to DACREF, and sequential voltage taps of 0V, 0.9999V, 2.0000V and 3.0001V would be produced from ground up. By comparison, assuming only resistor string 604 was used, the sequential voltage taps from ground up would instead be 0V, 1.0148V, 2.0197V and 3.0148V, a much less linearized range of analog output voltages. Accordingly, persons skilled in the art will appreciate that the effects of linear error gradients on the voltage taps (and therefore the analog output voltages) is greatly reduced in DAC 600 when compared to other known DACs. Moreover, the use of DAC resistive element 602 would at least reduce the effects of nonlinear error gradients in accordance with the principles of the present invention.

Persons skilled in the art will also appreciate, moreover, that although DAC 200 shown in FIG. 2 provides a DACREF which is scaled down from Vref, divide down resistive element 205 can often consume more space than is desirable for practical applications. DAC 600, in addition to reducing the effects of linear error gradients, also uses a divide down resistive element 608 with reduced space requirements in order to reduce Vref to a more desirable reference voltage level DACREF in accordance with the principles of the present invention.

In order to reduce the size and number of resistors being used in divide down resistive element 608, which preferably uses resistors having the same resistance as the resistors of DAC resistive element 602, the resistor values of the resistors in both divide down resistive element 608 and DAC resistive element 602 may be increased. For example, DAC resistive element 602 contains $2^N$ pairs of resistors connected in parallel that have resistor values substantially double that of the resistors that were used in resistor string 201 (neglecting the effects of error gradients). The resistor values in DAC 600 can be doubled by using resistors with the same length and half the width (and therefore half the area), given that resistance is inversely proportional to the width of a given resistor. Accordingly, in addition to divide down resistive element 608 requiring only half the number of resistors compared to divide down resistive element 205 of FIG. 2 to achieve the same divide down ratio, the resistors used in DAC 600 each have half the area (taking up approximately half the space once resistor spacing is taken into consideration) compared to the resistors used in DAC 200.

Persons skilled in the art will appreciate that although 2R resistors are shown in divide down resistive element 608, the invention is not limited in this manner. For example, persons skilled in the art will appreciate that other combinations of resistors may be used to reduce either the number of resistors or the size of the resistors, or both, in divide down resistive element 205 of FIG. 2 in accordance with the principles of the present invention. For example, the resistors of DAC resistive element 602 and divide down resistive element 608 can be multiplied by a factor of four (with respect to the resistors of DAC 200) to have resistors with a value of 4R (instead of 2R as shown, and again, neglecting the effects of error gradients). Accordingly, if DAC resistive element 602 includes $2^N$ series connected resistor circuits, with each resistor circuit having four 4R resistors coupled in parallel, then divide down resistive element 608 only requires one-quarter of the number of resistors compared to divide down resistive element 205 to achieve the same desired divide down ratio. Other combinations may also be used without departing from the scope of the present invention. DAC resistive element 602 may also have, for example, resistor circuits with eight 8R (neglecting the effects of error gradients) resistors coupled in parallel. In this case, divide down resistive element 608 only requires one-eighth of the number of resistors compared to divide down resistive element 205 of FIG. 2 to achieve the same desired divide down ratio. The invention is not limited with respect to the number of resistors that are coupled in parallel in each resistor circuit of DAC resistive element 602.

The remainder of DAC 600 functions substantially similarly to that of DAC 200 shown in FIG. 2 and explained above. Depending on the digital input signal, a particular switch in switching bank 202 closes, thereby selecting the voltage tap to be transmitted to the non-inverting terminal of amplifier 206.

Furthermore, even though a non-inverting amplifier 206 and feedback resistors 207 and 208 are used in DAC 600, the invention is not limited in this manner. It should be understood by persons skilled in the art that a unity gain buffer amplifier or any other suitable type of circuitry (or no circuitry at all) may be used in place of amplifier 206 and resistors 207 and 208 without departing from the scope of the present invention.

Persons skilled in the art should also appreciate that DAC 600 may operate without divide down resistive element 608, which is optional. Moreover, the benefits of divide down resistive element 608 may be realized in any DAC such as described in accordance with the present invention, with or without the inclusion of circuitry designed to offset the effects of error gradients. The invention is not limited in this manner.

Although coupling resistors from resistor string 604 and 608 together to form the parallel connections shown in FIG. 6 DAC 600 can greatly reduce the effects of linear error gradients, often times, these effects are not completely eliminated. Moreover, the necessary wiring to make the connections may be too cumbersome and not practical in many applications.

Figure 7:
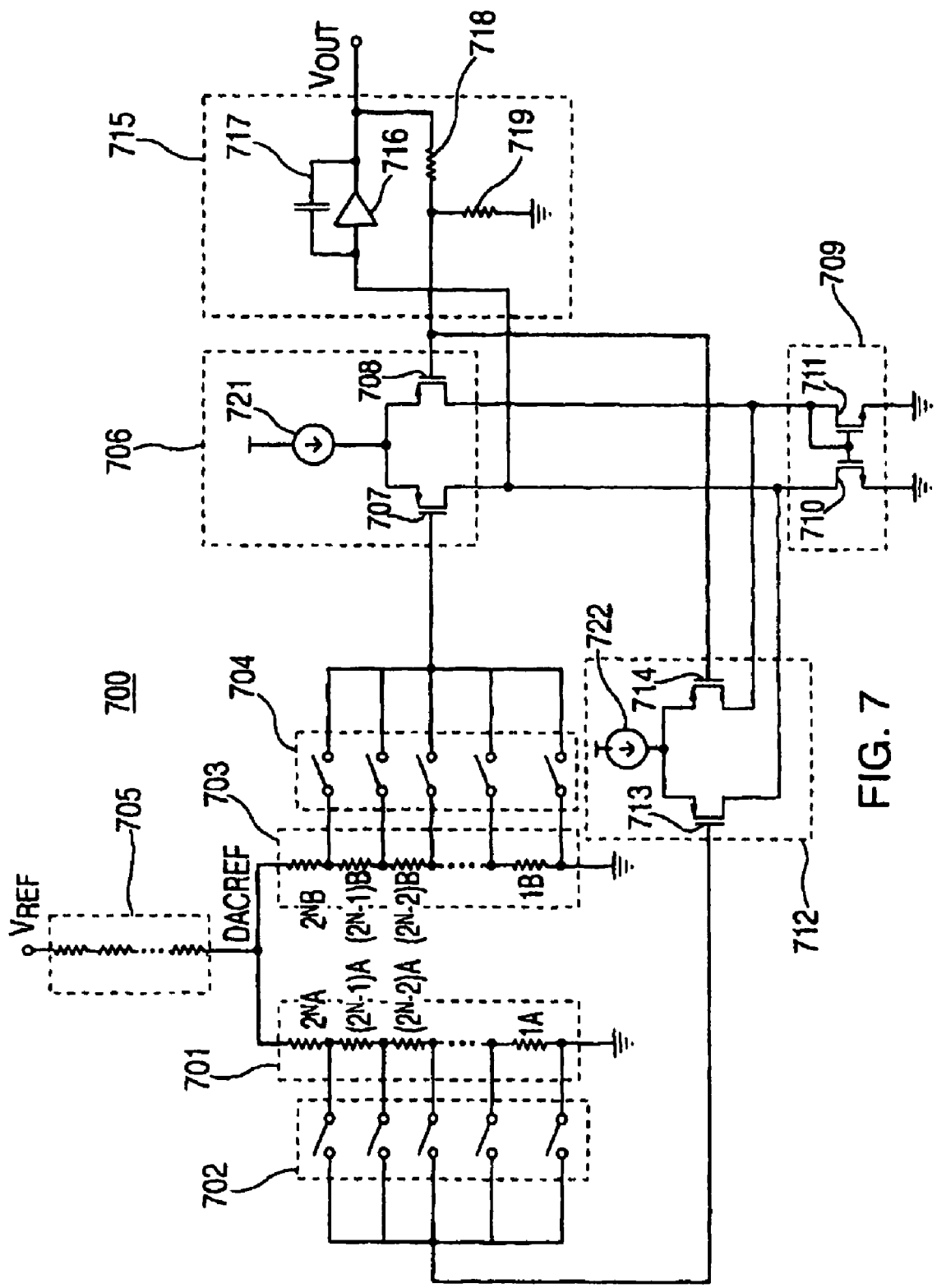
FIG. 7 is a schematic diagram of a resistor string DAC constructed to be at least partially insensitive to the effects of error gradients in accordance with the principles of the present invention.

In accordance with the principles of the present invention, a resistor string DAC 700 using a split-core resistive element (including resistor strings 701 and 703) is shown in FIG. 7 which substantially eliminates the effects of linear error gradients without requiring the formation of parallel connections such as with DAC 600.

Resistor strings 701 and 703 each consist of $2^N$ resistors, where again, N is the number of bits of the digital input signal to be converted by DAC 700. Depending on the digital input signal, corresponding switches from switching banks 702 and 704 are closed to provide one voltage tap from each of resistor strings 701 and 703. This can be accomplished using any suitable type of decoder to close the switches of switching banks 702 and 704 accordingly based on the digital input signal.

The cancellation of the effects of linear error gradients (or at least the reduction of the effects of nonlinear error gradients) on the resistor values of resistor strings 701 and 703 and on the analog output voltages of DAC 700 is possible because at least some (or each) of the resistors of resistor strings 701 and 703 may be laid out in a manner that provides a common centroid for the resistors with respect to the error gradients. Persons skilled in the art will appreciate that FIG. 7 (similar FIG. 6 described above) is a schematic diagram and that the physical layout of resistor strings 701 and 703 does not necessarily correspond to the manner in which resistors are laid out in FIG. 7. For example, resistor strings 701 and 703 may respectively be configured similar to the one-dimensional resistor strings 502 and 504 of resistor layout 500, shown in FIG. 5A, or the two-dimensional resistor strings 522 and 524 of resistor layout 520, shown in FIG. 5C.

Given the configuration of the resistors of resistor strings 701 and 703, it is possible to combine (e.g., average or add) the voltage taps from each of the resistor strings 701 and 703 in order to cancel or at least reduce the effects of error gradients. In other words, when the voltage taps from resistor strings 701 and 703 in DAC 700 are selected and averaged based on the digital input signal, the effects of the error gradients will at least partially offset each other. This results in the same output as if resistor strings with precisely matched resistors had been used. Moreover, persons skilled in the art will appreciate that, although circuitry for averaging the voltage taps from resistor strings 701 and 703 is described below, any suitable type of circuitry capable of combining voltage taps may be used without departing from the scope of the present invention. For example, instead of averaging the two voltage taps, an addition circuit may be used that combines the two voltage taps by adding the voltages together, thereby resulting in a similar reduction or cancellation of the effects of error gradients. Alternatively, combining voltage taps may simply include, as illustrated in FIG. 6, coupling the voltage taps together (although this decreases the amount by which the effects of error gradients may be reduced). The invention is not limited in this manner.

As an example of the manner in which the linear error gradients are cancelled, assume for DAC 700 that N=2 and DACREF is 4V. Moreover, assume that the four resistors from DACREF to ground in resistor string 701 have respective resistances of 0.85 kΩ, 0.95 kΩ, 1.05 kΩ and 1.15 kΩ, while the four resistors from DACREF to ground in resistor string 703 have respective resistances of 1.15 kΩ, 1.05 kΩ, 0.95 kΩ and 0.85 kΩ. This situation could occur, for example, if the top two resistors of resistor strings 701 and 703 are lined up next to each other at equal distances above the common centroid of the linear error gradients, while the bottom two resistors of resistor strings 701 and 703 are lined up next to each other at equal distances below the common centroid of the linear error gradients.

Given the values above, the sequential voltage tap values for resistor string 701, from ground up, would be 0V, 1.15V, 2.2V and 3.15V (using voltage division), and 0V, 0.85V, 1.80V and 2.85V, from ground up, for resistor string 703. Thus, by averaging the respective voltage taps corresponding to the various digital input signals, a substantially linearized step-up in the voltage level from ground to Vref results. For example, given the above values, the available averaged outputs are 0V at ground, followed by 1V, 2V and 3V beginning with the voltage tap above ground. In this manner, DAC 700 would be substantially insensitive to any linear error gradients that are present (e.g., the analog output voltages of DAC 700 increase substantially linearly as the digital input signal is increased).

Persons skilled in the art will appreciate that the above described configurations of resistors with respect to error gradients is only representative of the manner in which the effects of error gradients may be reduced or eliminated in a resistor string DAC in accordance with the principles of the present invention. For example, resistor strings 701 and 703 may be configured such that all of the resistors of resistor string 701 are located above the common centroid, while all of the resistors of resistor string 703 are located below the common centroid. In this case, for example, the resistors of resistor string 701 may have values of 0.85 k$\Omega$, 0.95 k$\Omega$, 1.05 k$\Omega$ and 1.15 k$\Omega$. Meanwhile, the deviation in resistor values of resistor string 703 may continue such that the resistors of resistor string 703 have values of 1.25 k$\Omega$, 1.35 k$\Omega$, 1.45 k$\Omega$ and 1.55 k$\Omega$. Lining up the resistors such that the 1.15 k$\Omega$ resistor end of resistor string 701 and the 1.25 k$\Omega$ resistor end of resistor string 703 are connected to DACREF (e.g., 4V), while the other ends of resistor strings 701 and 703 are connected to ground, the voltage taps from resistor strings 701 and 703 can be averaged to produce analog output voltages of 0V, 0.9785V, 1.9715V and 2.9785V from ground up. Compared to the analog output voltages that result from using only resistor string 701 (0V, 0.85V, 1.8V and 2.85V from ground up), it is clear that the effects of error gradients are greatly reduced. The invention is not limited in this respect. Moreover, it should be understood that while the provided deviations in resistor values due to error gradients are relatively extreme in the examples above for DAC 700, the principles of the present invention may be utilized by substantially any resistor string DAC to enhance the linearity of its analog output voltage, regardless of whether such deviations are relatively small or large.

To accomplish the averaging described above, DAC 700 uses an averaging circuit that includes first differential transconductance stage (DTS) 706 and second differential transconductance stage (DTS) 712. DAC 700 also includes current mirror 709 and amplifier gain circuitry 715, which includes amplifier 716, capacitor 717 and resistors 718 and 719.

The output of switching bank 704 is coupled to the input of DTS 706, which includes current source 721 and transistors 707 and 708. The drains of transistors 707 and 708 form first and second differential current outputs of DTS 706, respectively. The difference between the currents flowing from the drains of transistors 707 and 708 create a differential current generated by DTS 706.

The second input of DTS 706 is coupled to Vout (the output of amplifier 716) through feedback resistor 718. In the absence of DTS 712, the negative feedback path, including resistors 718 and 719, would ensure that the currents flowing out of the drains of transistors 707 and 708 are substantially equal. This, in turn, would ensure that the gate voltages of transistors 707 and 708 are substantially equal.

Meanwhile, as illustrated in FIG. 7, the output of switching bank 702 is coupled to the input of DTS 712, which includes current source 722 and transistors 713 and 714. The second input of DTS 712 is coupled to the second input of DTS 706.

The drains of the transistors 713 and 714 form respective first and second differential current outputs of DTS 712 (much like transistors 707 and 708 of DTS 706). Moreover, the difference between the currents flowing from the drains of transistors 713 and 714 create the differential current generated by DTS 712.

When equal currents flow out of the drains of transistors 713 and 714, the output Vout is substantially unaffected by the presence of components 713, 714 and 722, due to the action of current mirror 709 (made up of transistors 710 and 711). This equal current will flow when the gates of transistors 713 and 714 are at equal voltages, and because the gate of transistor 714 is coupled to the gate of transistor 708, this will occur when the output of switching bank 702 matches the output of switching bank 704. Given the effect of linear error gradients, however, the respective voltages at the gates of transistors 707 and 713 will likely not be matched, and therefore, current mirror 709 will cause an averaging of these voltages to appear at Vout (adjusted by resistors 718 and 719).

The inclusion of DTS 712 causes the voltage at the gates of transistors 708 and 714 to be halfway between the voltage outputs of switching banks 702 and 704. This is because the voltage output at the gates of transistors 708 and 714 will swing until the currents into the current mirror 709 are equal, which happens when the sum of the two differential currents from DTS 712 and DTS 706 is zero (e.g., the differential current from DTS 706 is equal and opposite to the differential current from DTS 712). This occurs when the differential voltages in the respective transistors of DTS 706 and 712 are equal and opposite. For example, if the gate voltage of transistor 707 is higher then the gate voltage of transistor 708 by 5 mV, then the gate voltage of transistor 713 is less than the gate voltage of transistor 714 by 5 mV. This is what happens, for example, if the output from switching bank 704 is 10 mV higher than output from switching bank 702. In this manner, the common gate of transistors 708 and 714 will always be adjusted to be halfway between the output voltages from switching bank 704 and switching bank 702.

Persons skilled in the art will appreciate that achieving the type of averaging described above depends on DTS 706 and 712 having substantially equal transconductance (Gm) values because the Gm values determine the necessary magnitude of differential voltages required to generate a given differential current. For this reason, the Gm values should be as close as possible if precise averaging is desired. The invention, however, is not limited in this manner. For example, DTS 706 and 712 may have GM values that are not identical if exact averaging is not desired.

Persons skilled in the art will also appreciate that any other type of suitable circuitry capable of combining voltage taps from resistor strings 701 and 703 (e.g., averaging the selected voltage taps from resistor strings 701 and 703) may be used without departing from the scope of the present invention. Alternatively, as explained above, circuitry may be used in accordance with the principles of the present invention that, instead of averaging, adds the voltage taps from resistor strings 701 and 703 together to provide the analog output voltages. In this case, DACREF may be reduced by a factor of two in order to produce substantially the same output as if averaging of the voltage taps was done. Alternatively, instead of reducing DACREF, the analog voltage output can be reduced through voltage division (or any other suitable manner of attenuation) to a more desirable level. Moreover, although divide down resistive element 705 can be used to manipulate Vref in order to produce any desired value for DACREF, divide down resistive element 705 can also be eliminated from the circuit altogether if unnecessary. The invention is not limited in this manner.

Figure 8A:
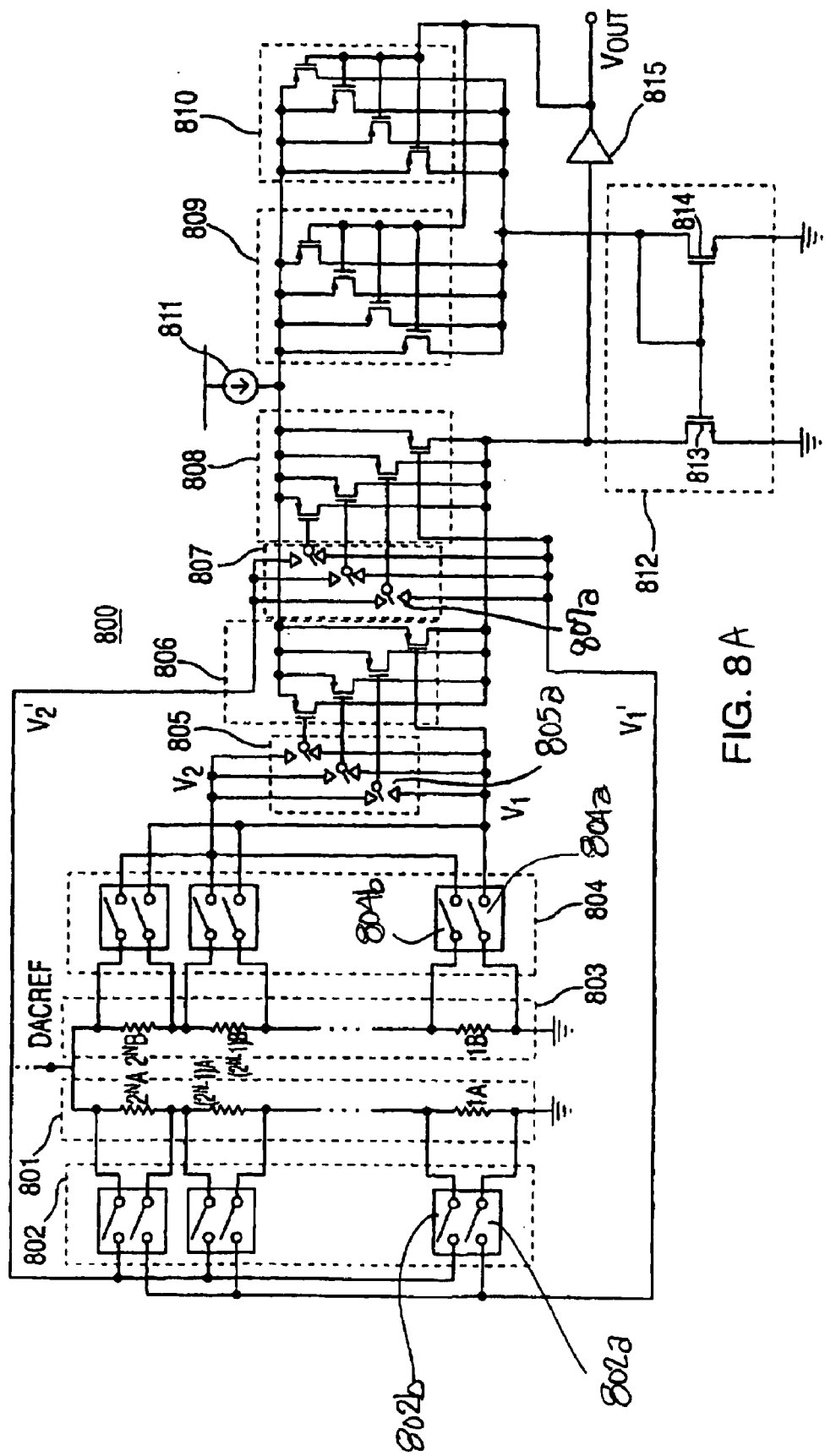
FIG. 8A is a schematic diagram of an interpolating amplifier DAC constructed to be at least partially insensitive to the effects of error gradients in accordance with the principles of the present invention.

In addition to the resistor string DACs described above, the principles of the present invention can also be applied to interpolating amplifier DACs. FIG. 8A shows an embodiment of a gradient insensitive interpolating amplifier DAC using a split-core resistive element that includes resistor strings 801 and 803 in accordance with the principles of the present invention. Persons skilled in the art will appreciate that the layout of resistor strings 801 and 803 may be similar to that of resistor layouts 500 or 520 in accordance with the principles of the present invention. The invention is not, however, limited to the specific resistor layouts described herein Using the same error averaging concept as presented in connection with DAC 700 of FIG. 7, the circuit of FIG. 8A utilizes the common centroid of the error gradients affecting the resistors in the split-core resistive element to cancel the effects of the error gradients. As explained above for the DAC 700 shown in FIG. 7, the resistors of resistor strings 801 and 803 are laid out in such a manner, for example, that a common centroid exists with respect to any error gradients that affect DAC 700. Accordingly, it becomes possible to combine (e.g., average or add) the voltage taps transmitted from resistor strings 801 and 803 in order to at least partially cancel the effects of the error gradients.

DAC 800 of FIG. 8A operates by using two substantially identical interpolators interconnected as shown to form a single interpolation circuit that interpolates between two separate pairs of voltage taps from resistor strings 801 and 803. The first of the two interconnected interpolators includes switching device bank 805 and composite PMOS transistors 806 and 809, while the second includes switching device bank 807 and composite PMOS transistors 808 and 810. Switching device banks 802 and 804 use the MS digital subword to select the respective pairs of voltage taps, while switching device banks 805 and 807 use the LS digital subword to properly produce the desired interpolated analog voltage signal.

Current source 811 feeds the sources of composite transistors 806 and 808, and composite transistors 809 and 810, whose drains are respectively coupled to the drains of NMOS transistors 813 and 814 (which constitute current mirror 812). The drain of transistor 813 is coupled to the input of high-gain, inverting amplifier 815, the output of which supplies the analog output voltage and is fed back to the subtransistor gates of composite transistors 809 and 810.

Interpolating amplifier DAC 800 selects two pairs of voltage taps ($V_1$, $V_2$ and $V_1'$, $V_2'$) based on the MS digital subword. The LS digital subword, meanwhile, produces an output voltage level between the average of the voltage tap levels (e.g., between $(V_1+V_1')/2$ and $(V_2+V_2')/2$). For example, if all of the switches in switching device banks 805 and 807 are in their normal positions (when the LS digital subword is zero), then each of the subtransistors of composite PMOS transistor 806 are switched to $V_1$, while each of the subtransistors of composite PMOS transistor 808 are switched to $V_1'$. When this occurs, the output voltage is halfway between $V_1$ and $V_1'$ (i.e., the average of $V_1$ and $V_1'$). As the LS digital subword is increased, kL (the decimal equivalent of the LS digital subword) subtransistors in composite transistors 806 and 808 are switched to $V_2$ and $V_2'$, respectively. In this manner, the interpolated voltage increases in even steps toward a value halfway between $V_2$ and $V_2'$.

In the embodiment of FIG. 8A, all intermediate nodes of resistor string 801 (i.e., all nodes except the first and last nodes) can be selectively connected to either voltage tap $V_1'$ or voltage tap $V_2'$ through switching device bank 802, depending on the MS digital subword. Thus, each intermediate node of resistor string 801 is coupled to two switches of switching bank 802—a first switch to selectively connect the node to voltage tap $V_1'$ and a second switch to selectively connect the node to voltage tap $V_2'$. Similarly, each intermediate node of resistor string 803 can be selectively connected to either voltage tap $V_1$ or voltage tap $V_2$ through switching device bank 804, depending on the MS digital subword. Again, each intermediate node of resistor string 803 is coupled to two switches of switching bank 804.

In some cases, each switch connected to resistor strings 801 and 803 may negatively influence the performance of DAC 800 through parasitic components associated therewith, such as leakage current, diffusion capacitance, etc. The physical size of each switch also may increase the overall DAC size and cost. Accordingly, it may be desirable, in some cases, to reduce the total number of switches in switching banks 802 and 804.

Figure 8B:
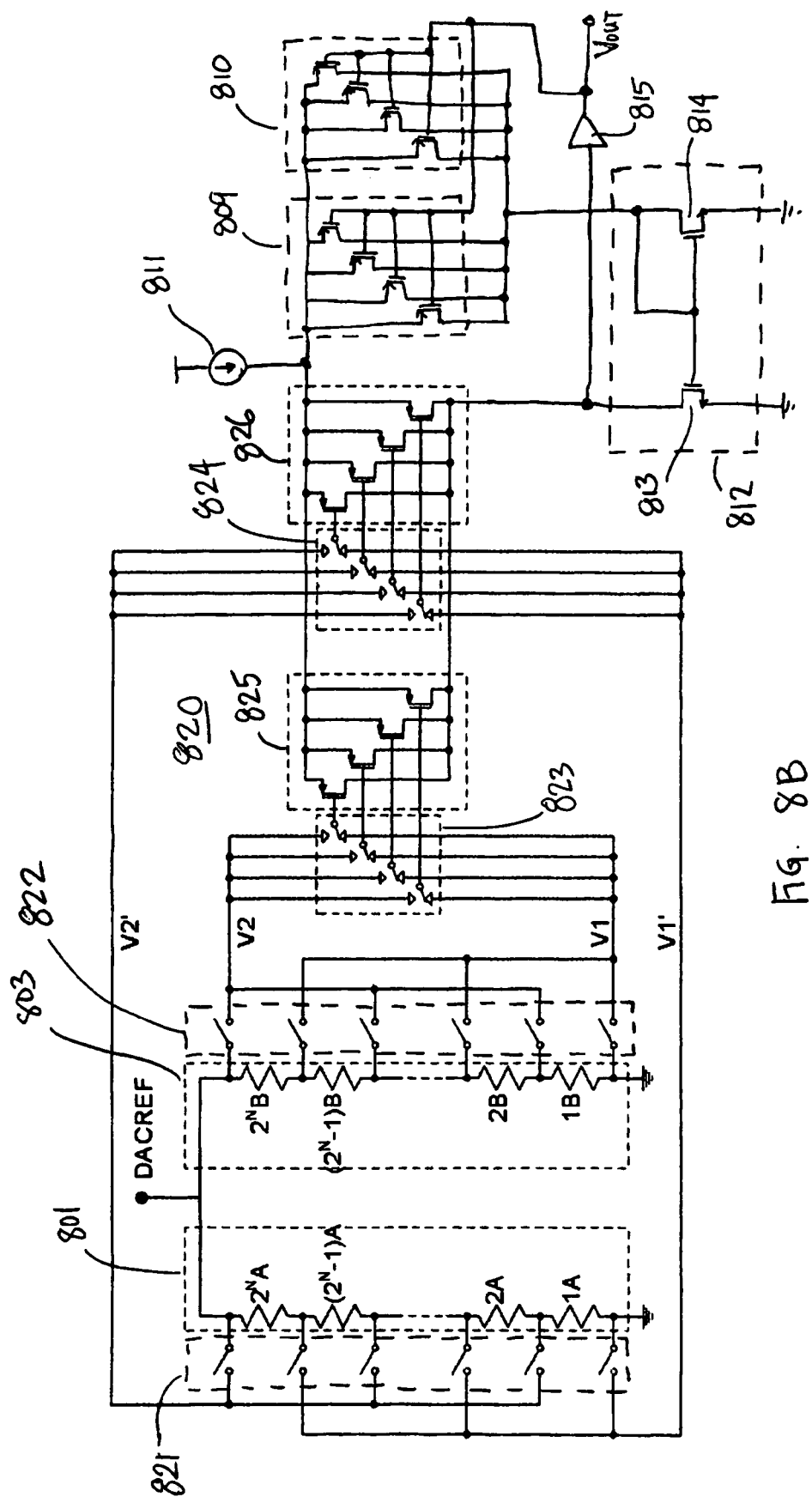
FIG. 8B is a schematic diagram of an alternative embodiment of an interpolating amplifier DAC constructed to be at least partially insensitive to the effects of error gradients in accordance with the principles of the present invention.

FIG. 8B illustrates an alternative embodiment of an interpolating amplifier DAC. DAC 820 is similar to DAC 800 of FIG. 8A, except that the total number of switches coupled to resistor strings 801 and 803 is reduced. In DAC 820, every other node of resistor string 801 is coupled to voltage tap $V_1'$ through switching device bank 821, while the remaining nodes are coupled to voltage tap $V_2'$. Thus, each node of resistor string 801 is coupled to a single switch of switching bank 821, as compared to switching bank 802 of DAC 800 in which each intermediate node is coupled to two switches. Similarly, every other node of resistor string 803 is coupled to voltage tap $V_1$ through switching device bank 822, while the remaining nodes are coupled to voltage tap $V_2$. Again, each node of resistor string 803 is coupled to a single switch of switching bank 822, as compared to switching bank 804 of DAC 800.

The MS digital subword instructs switching bank 821 to selectively connect a pair of voltage taps across a select resistor of resistor string 801 to $V_1'$ and $V_2'$. Likewise, the MS digital subword instructs switching bank 822 to selectively connect a pair of voltage taps across a select resistor of resistor string 803 to $V_1$ and $V_2$. Because each voltage tap of resistor string 801 can only be connected to either $V_1'$ or $V_2'$, $V_1'$ can be greater than $V_2'$ or vice versa, depending on the voltage taps of resistor string 801 that are selected by the MS digital subword. Similarly, because each voltage tap of resistor string 803 can only be connected to either $V_1$ or $V_2$, $V_1$ can be greater than $V_2$ or vice versa, depending on the voltage taps of resistor string 803 that are selected by the MS digital subword. Thus, one or more bits of the MS digital subword encode the relationship between $V_1'$ and $V_2'$ (and between $V_1$ and $V_2$). When the bits of the MS digital subword are combined with those of the LS digital subword in a standard digital decoder, switching device banks 823 and 824 can be controlled so as to respectively produce the desired interpolated analog voltage between $V_1$ and $V_2$ and the desired interpolated analog voltage between $V_1'$ and $V_2'$.

For example, when the LS digital subword is zero and the MS digital subword has a value that causes $V_2'$ to be greater than $V_1'$ and $V_2$ to be greater than $V_1$, the decoder will cause the subtransistors of composite transistor 826 and 825 to be connected to $V_1'$ and $V_1$, respectively. As a result, the interpolator output will be the average of $V_1'$ and $V_1$. When the LS digital subword increases in value, some of the subtransistors of composite transistor 826 will switch from $V_1'$ to $V_2'$ and some of the subtransistors of composite transistor 825 will switch from $V_1$ to $V_2$. As a result, the interpolator output will increase to a value that is an average of an intermediary value between $V_1$ and $V_2$, and an intermediary value between $V_1$ and $V_2$. When the LS digital subword increases to its maximum value, each subtransistor of composite transistors 826 and 825 will be switched to $V_2'$ and $V_2$, respectively. As a result, the interpolator output will increase to a value that is an average of $V_2'$ and $V_2$.

By contrast, when the LS digital subword is zero and the MS digital subword has a value that causes $V_1'$ to be greater than $V_2'$ and $V_1$ to be greater than $V_2$, the decoder will cause the subtransistors of composite transistor 826 and 825 to be connected to $V_2'$ and $V_2$, respectively. As a result, the interpolator output will be the average of $V_2'$ and $V_2$. When the LS digital subword increases in value, some of the subtransistors of composite transistor 826 will switch from $V_2'$ to $V_1'$ and some of the subtransistors of composite transistor 825 will switch from $V_2$ to $V_1$. As a result, the interpolator output will increase to a value that is an average of an intermediary value between $V_2'$ and $V_1'$ and an intermediary value between $V_2$ and $V_1$. When the LS digital subword increases to its maximum value, each subtransistor of composite transistor 826 and 825 will be switched to $V_1'$ and $V_1$, respectively. As a result, the interpolator output will increase to a value that is an average of $V_1'$ and $V_1$.

Persons skilled in the art will appreciate that although an interpolation circuit (consisting of two identical interpolators) is shown in FIGS. 8A-8B that interpolates between two separate pairs of voltage taps, using current mirror 812 and amplifier 815, the invention is not limited in this manner. For example, two independent interpolators may be used to respectively interpolate between a pair of voltage taps from resistor string 801 and a pair of voltage taps from resistor string 803, in which case additional circuitry (such as shown in FIG. 7) may be used to combine the two resulting interpolated voltage levels to produce the analog output signal of DACs 800 and 820. Moreover, persons skilled in the art will also appreciate that, as explained above, DACREF can be varied by using, for example, a divide down resistive element. Alternatively, voltage division can be introduced at the amplifier output in order to adjust the analog output level range as desired.

Figure 9:
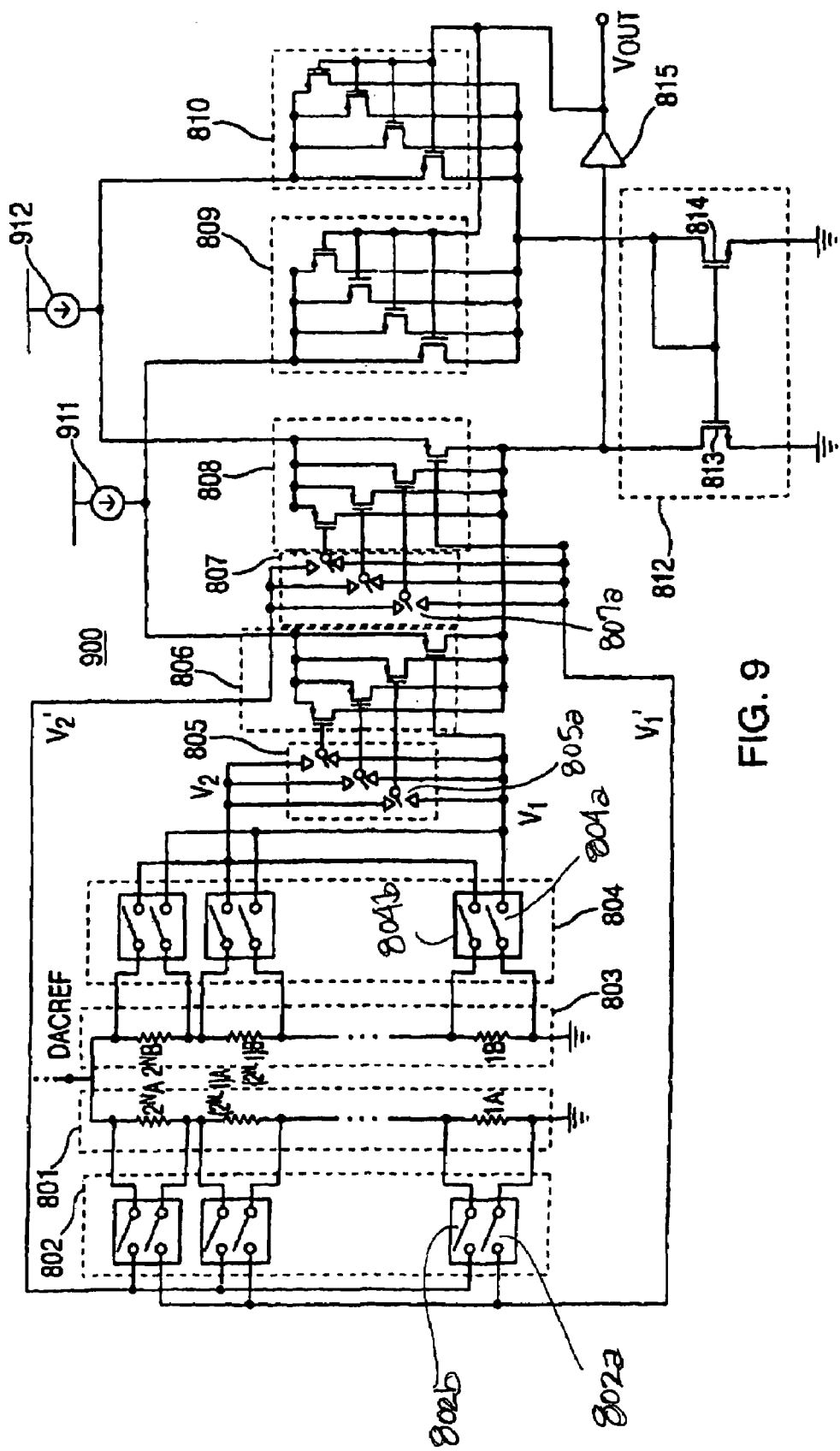
FIG. 9 is a schematic diagram of another embodiment of an interpolating amplifier DAC constructed to be at least partially insensitive to the effects of error gradients in accordance with the principles of the present invention.

FIG. 9 shows one embodiment of an interpolating amplifier DAC using a split-core resistive element that is substantially insensitive to error gradients. DAC 900 is substantially similarly to DAC 800 of FIG. 8A, except that DAC 900 uses a split current source (current sources 911 and 912) instead of using a single current source 811 as shown in FIG. 8A. These current sources feed the sources of composite transistors pairs 806-809 and 808-810. By using two current sources 911 and 912 as shown, the differential nonlinearity (DNL) of DAC 900 may be substantially reduced with only minor modifications when compared to DAC 800 of FIG. 8A, where the DNL is a measure of the worst case deviation from the 1 least significant bit (LSB) step in the analog output voltage of DAC 900.

In an alternative embodiment of DAC 900, the total number of switches in switching banks 802 and 804 can be reduced in a manner similar to that described with respect to FIG. 8B.

In accordance with another embodiment of the present invention, the multiple interpolators of an interpolating digital-to-analog converter of the present invention (e.g., DACs 800, 820, and 900) can be controlled in such a manner so as to maintain the overall DAC resolution while decreasing circuit complexity. Alternatively, the multiple interpolators can be controlled in such a manner so as to increase the overall resolution of the DAC with only a limited increase in circuit complexity.

For example, as described in greater detail below with respect to FIG. 10, an interpolating DAC constructed using two interpolators can be modified to produce an output analog signal with a "half-step" resolution simply by controlling corresponding switches in the two interpolator switching banks (e.g., switching banks 805 and 807 of FIG. 9) using different combinations of bits from the DAC digital input signal. Instead of simultaneously advancing both interpolators for every successive step change in the digital input signal, a first interpolator of the two interpolators can be advanced without advancing the second interpolator. In response to a change in at least an additional least significant bit, the second interpolator can be advanced. Thus, the DAC overall resolution can be increased by at least one bit without substantially increasing the circuit complexity. Alternatively, by using the present invention to produce a "half-step" resolution, an interpolating DAC core of less circuit complexity can be constructed with at least one additional bit of resolution.

As another example, an interpolating DAC constructed using four interpolators can be modified to produce an output analog signal with a "quarter-step" resolution simply by controlling corresponding switches in the four interpolator switching banks using different combinations of bits from the DAC digital input signal. Instead of simultaneously advancing all four interpolators for every successive step change in the digital input signal, at least two additional least significant bits can be incorporated within the digital input signal and each interpolator can be individually advanced in response to successive step changes in the digital input signal. That is, a first interpolator can be advanced first with the first step change in the digital input signal. A second interpolator then can be advanced with the second step change in the digital input signal. A third interpolator can be advanced with the third step change in the digital input signal. A fourth interpolator can be advanced with the fourth step change in the digital input signal. Thus, the overall DAC resolution can be increased by at least two bits without substantially increasing the circuit complexity. Alternatively, by using the present invention to produce a "quarter-step" resolution, an interpolating DAC core of less circuit complexity can be constructed with at least two additional bits of resolution.

By controlling corresponding switches contained in the switching bank of each one of the interpolators using different combinations of bits from the digital input signal, a tradeoff can be made among the overall resolution of the DAC, the accuracy of the DAC, and the complexity of the DAC (as measured by the number and resolution of the interpolators included in the interpolating circuit). For example, while the resolution of the DAC can be increased, the accuracy of the DAC may not increase by an equivalent amount because the fractional steps described above may not permit circuit imperfections from all of the interpolators to be immediately averaged out.

Nevertheless, there may be certain applications (e.g., communications signal generations) in which it may be beneficial to improve the output signal distortions at the expense of the output signal noise floor. Thus, in such applications it may be beneficial to produce the above-described fractional steps by advancing different interpolators at different times to cause the circuit imperfections from all of the interpolators to be averaged out over time. For example, in the above-discussed illustration in which an interpolating DAC comprises two interpolators, the half-step output signal can be produced by advancing only the first interpolator at certain times (e.g., half the time), while producing the same half-step output signal by advancing only the second interpolator at other times. This can generate a time average of circuit errors over both interpolators. Similarly, in the above-discussed example in which an interpolating DAC comprises four interpolators, the quarter-step output signal can be created at various times in four different ways by advancing any one of the four interpolators. The half-step output signal can be produced at various times in six different ways by advancing any two of the four interpolators. The three-quarter-step output signal also can be produced at various times in four different ways by advancing any three of the four interpolators.

Figure 10:
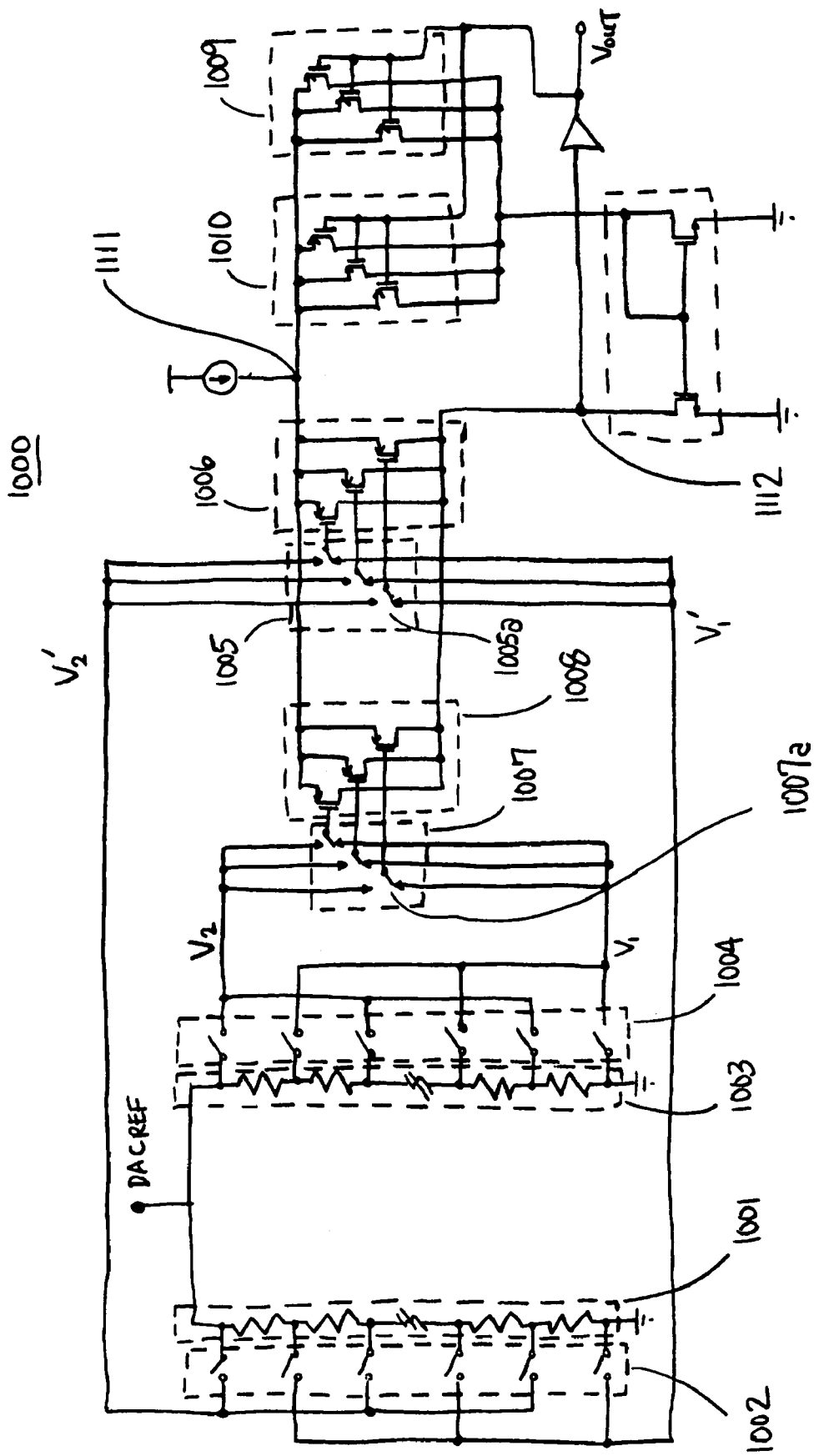
FIG. 10 is a diagram of yet another embodiment of an interpolating amplifier DAC constructed to be at least partially insensitive to the effects of error gradients in accordance with the principles of the present invention.

FIG. 10 illustrates a preferred embodiment of the present invention, in which a DAC comprises less complex circuitry than DACs 800, 820, and 900 while maintaining the same overall resolution. Like the DACs of FIGS. 8A-9, DAC 1000 of FIG. 10 also incorporates a split core resistive element coupled to an interpolation circuit. Illustratively, DAC 1000 includes two substantially identical interpolators interconnected to form a single interpolation circuit that interpolates between two separate pairs of voltage taps from resistor strings 1001 and 1003. The first of the two interconnected interpolators is coupled to resistor string 1001 and includes, e.g., switching device bank 1005 and composite transistors 1006 and 1009. The second of the two interconnected interpolators is coupled to resistor string 1003 and includes, e.g., switching device bank 1007 and composite transistors 1008 and 1010. The weights of corresponding subtransistors in composite transistors 1006 and 1008 can be equivalent. Likewise, the weights of corresponding subtransistors in composite transistors 1009 and 1010 can be equivalent.

Switching device bank 1002 is coupled to resistor string 1001 and switching device bank 1004 is coupled to resistor string 1003. Both switching device banks 1002 and 1004 can use at least the more significant bits from the digital input signal to select pairs of voltage taps from resistor strings 1001 and 1003, respectively producing voltage levels $V_1'$, $V_2'$ and $V_1$, $V_2$. Switching banks 1005 and 1007 can selectively couple the subtransistors in composite transistors 1006 and 1008 to voltage levels $V_1'$, $V_2'$ and $V_1$, $V_2$ based at least on the less significant bits from the digital input signal.

One of the differences between DAC 1000 and DACs 800, 820, and 900 is that DAC 1000 can incorporate smaller interpolators (e.g., less switches in banks 1005 and 1007 and less subtransistors in composite transistors 1006, 1008, 1009, 1010) than DACs 800, 820, and 900 to obtain the same bits of resolution, thereby reducing the cost, size, and complexity of the circuit. In one embodiment of the present invention, DAC 1000 accomplishes this for predetermined digital input signals by controlling corresponding switches in interpolator switching banks 1005 and 1007 using different combinations of bits from the DAC digital input signal to produce an output analog signal with a "half-step" resolution. Instead of simultaneously advancing both interpolators for every successive step change in the digital input signal, one of the interpolators (e.g., comprising switching device bank 1005 and composite transistors 1006 and 1009) can be advanced without advancing the second interpolator (e.g., comprising switching device bank 1007 and composite transistors 1008 and 1010), thereby advancing the DAC by a "half-step." Thereafter, in response to a change in at least an additional least significant bit of the digital input signal, the second interpolator can be advanced by another "half-step." In contrast, DACs 800, 820, and 900 advance both interpolators simultaneously with each change in the digital input signal.

In one embodiment of the present invention, DAC 1000 switches the switches of device bank 1005 in a different pattern (or alternatively referred to herein as a different sequence) as compared to the pattern (or sequence) in which DAC 1000 switches the switches of device bank 1007 for one or more digital input signals. For other digital input signals, however, the switches of switching device bank 1005 are switched in the same pattern (or sequence) as the pattern (or sequence) in which the switches of device bank 1007 are switched.

In contrast, for example, DACs 800 and 900 drive the switches of switching bank 807 in the same pattern (or sequence) as the pattern (or sequence) in which the switches of switching bank 805 are driven. For example, in DACs 800 and 900, when switch 807a switches from $V_1'$ to $V_2'$, the corresponding switch in switch bank 805 (e.g., switch 805a) also can switch from $V_1$ to $V_2$ (see FIGS. 8A and 9). This process obtains a result having a predetermined resolution.

DAC 1000 can extract a result having the same resolution with smaller interpolators, however, by switching one or more of the switches in switching device bank 1005 from $V_1'$ to $V_2'$ without switching the corresponding switch or switches in switching device bank 1007 from $V_1$ to $V_2$ (or vice versa).

In a preferred embodiment of the invention, this can be accomplished by coordinating the switching so as to drive one of the switches in bank 1005, e.g., switch 1005a, with at least the least significant bit (LSB) of the digital input signal (either alone or in logical combination with another bit or bits) and drive the corresponding switch in bank 1007, e.g., switch 1007a, with another bit or bits of the digital input signal, e.g., at least the most significant bit of the less significant bits used to control switching banks 1005 and 1007. Each remaining switch in bank 1005 can be driven with the same bit or bits as the corresponding switch in bank 1007. Similarly, each switch in bank 1002 can be driven with the same bit or bits as the corresponding switch in bank 1004. In a preferred embodiment of the invention, none of the switches in switching bank 1007 are driven with the LSB of the digital input signal.

Figure 11A:
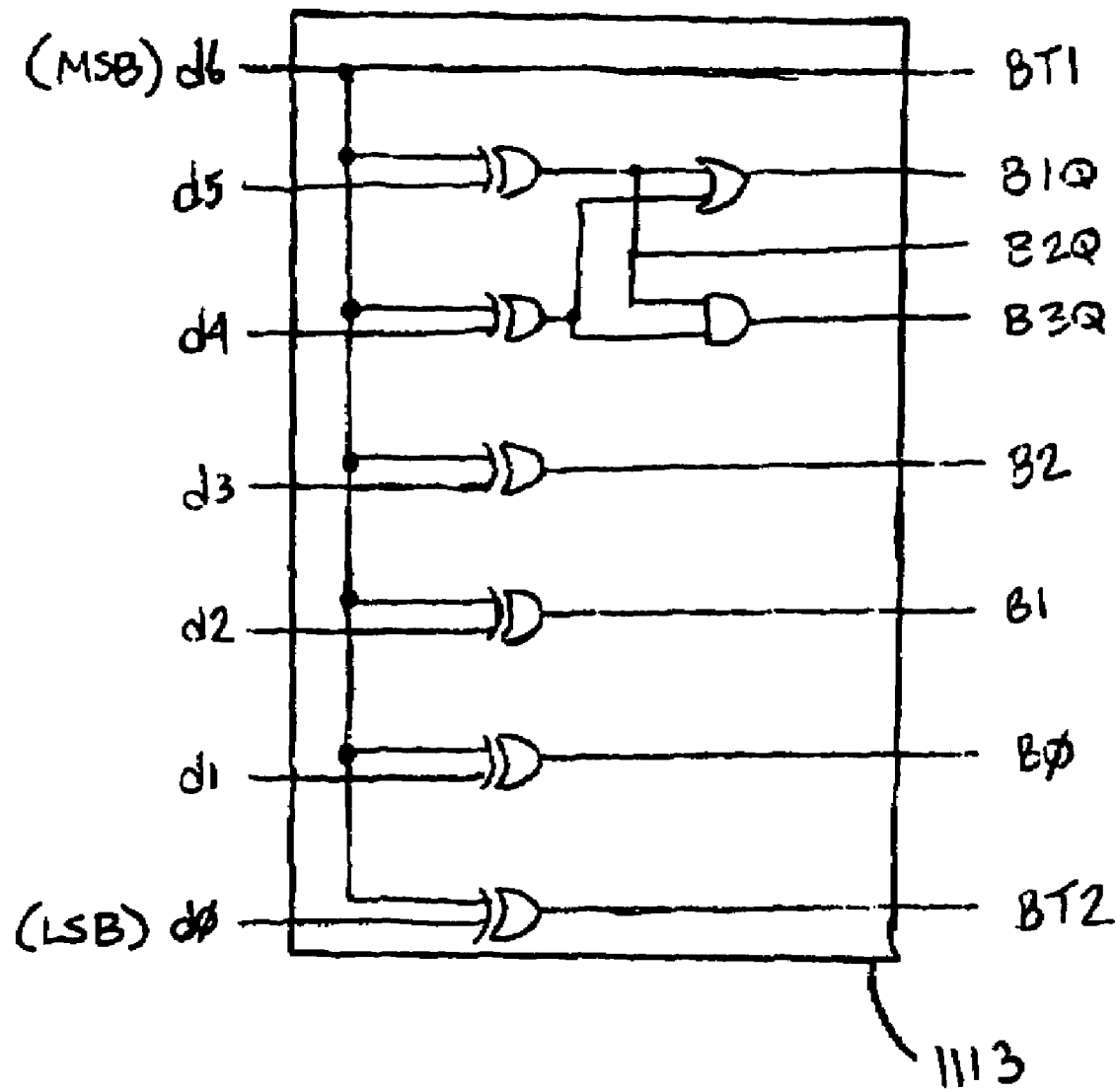
FIGS. 11A-C are schematic diagrams of an exemplary decoder and switching banks for use with the interpolating amplifier DAC of FIG. 10.
Figure 11B:
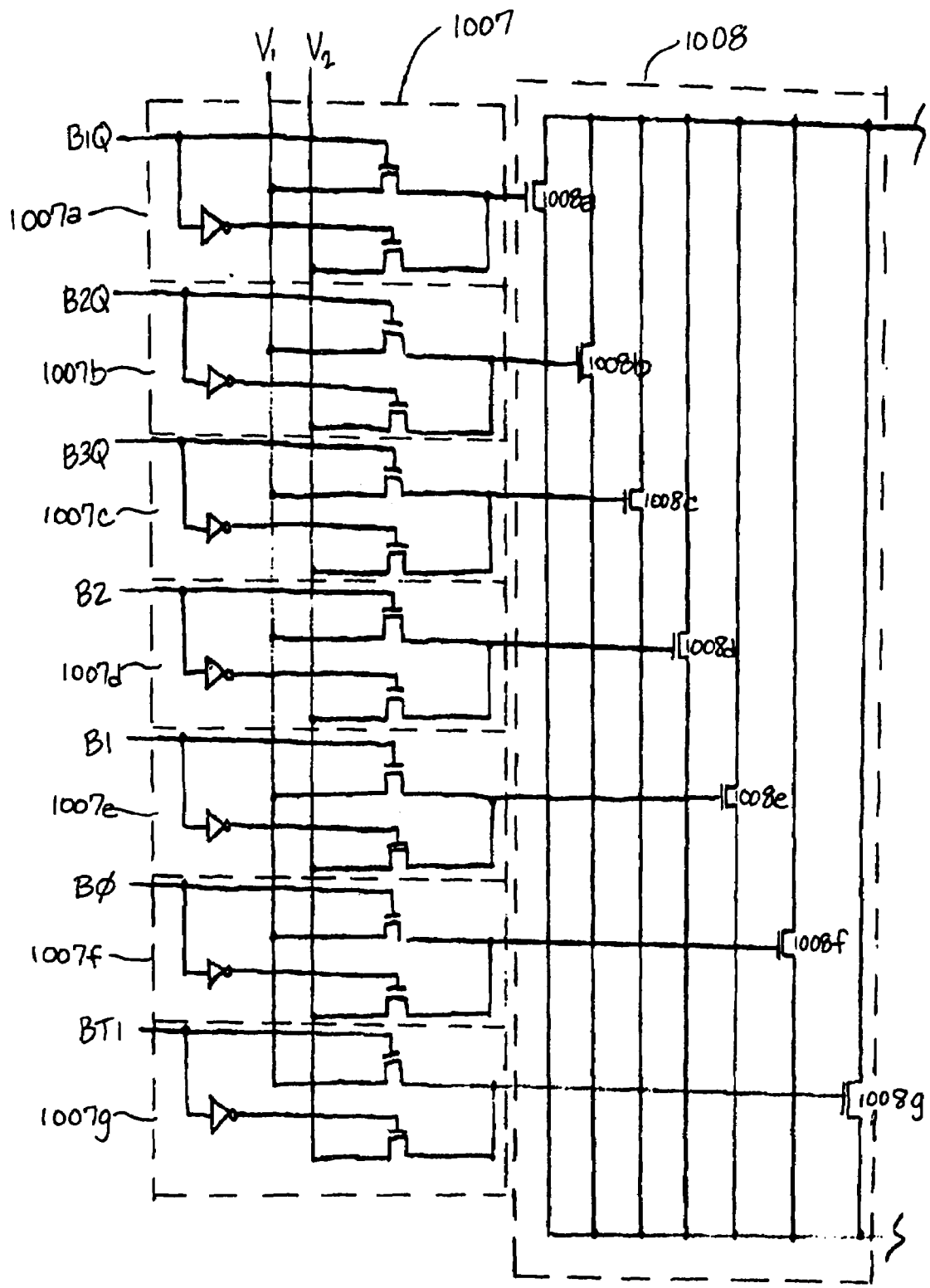
Figure 11C:
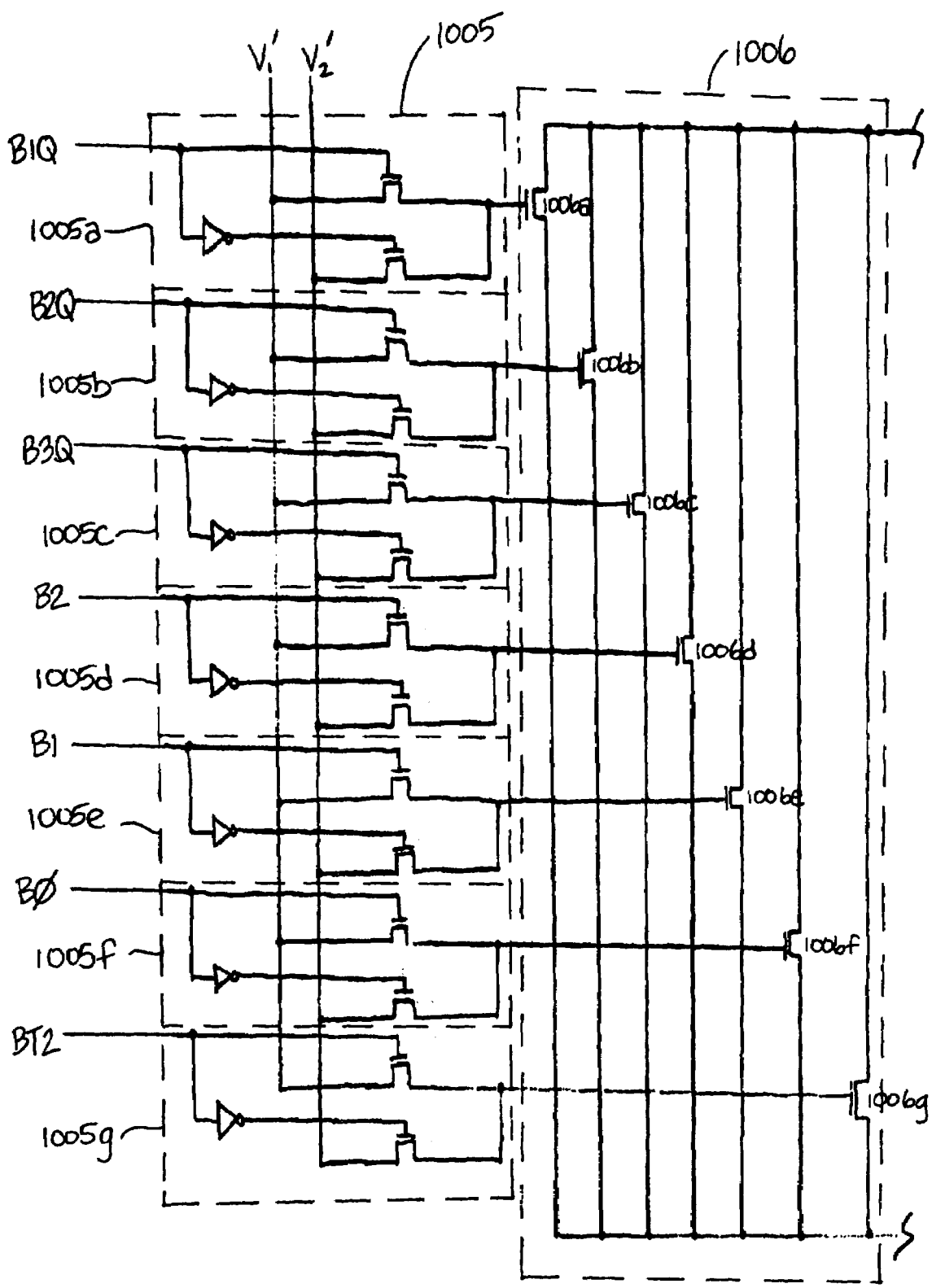

FIGS. 11A-C provide illustrative decoder 1113 and illustrative switching banks 1005 and 1007 for use with the interpolating amplifier DAC of FIG. 10 in accordance with one embodiment of the present invention. Decoder 1113 comprises logic configured to accept a seven-bit digital signal d0-d6, e.g., the seven least significant bits of a digital input signal, and to output decoded digital signals BT1, B1Q, B2Q, B3Q, B2, B1, B0, and BT2 to control switching banks 1005 and 1007 in a manner described above with respect to FIG. 10. In the illustrative embodiment of FIG. 11A, the least significant bit (LSB) input is bit d0 and the most significant bit (MSB') of the seven bits used to control device banks 1005 and 1007 is bit d6. Switches 1007a-1007g of switching bank 1007 respectively correspond to switches 1005a-1005g of switching bank 1005. Corresponding switches in switching banks 1007 and 1005 can have equivalent weights. Note that the MSB' designation used herein refers to the most significant bit of the bits used to control device banks 1005 and 1007, which may or may not be the most significant bit of the entire digital input signal.

In the illustrative embodiment of FIGS. 11A-C, switching device bank 1005 comprises switches 1005a-1005g. Each switch selectively couples either voltage line $V_1$ or voltage line $V_2'$ to a subtransistor in composite transistor 1006 depending on the value of the decoded digital signals from decoder 1113. Likewise, switching device bank 1007 comprises switches 1007a-1007g. Each switch selectively couples either voltage line $V_1$ or voltage line $V_2$ to a subtransistor in composite transistor 1008 depending on the value of the decoded digital signals from decoder 1113. Illustratively, switch 1007g of device bank 1007 can at least be driven by the MSB' whereas corresponding switch 1005g of device bank 1005 can at least be driven by the logical combination (e.g., XOR) of the LSB and the MSB'. The remaining switches in device bank 1005 respectively can be driven with at least the same bit or bits as the corresponding switches in device bank 1007.

In the illustrative embodiment of the invention shown in FIGS. 11A-C, when the LSB and the MSB' are both 0, the switches of device banks 1005 and 1007 can be switched in the same pattern (or sequence). For example, when the LSB and the MSB' are both 0 and the base of subtransistor 1008a is switched to voltage line $V_1$, the base of subtransistor 1006a also is switched to voltage line $V_1$. Likewise, when the bases of subtransistors 1008b-1008g are switched to voltage line $V_2$, the bases of subtransistors 1006b-1006g also are switched to voltage line $V_2'$.

However, when the LSB input is 1 and the MSB' is 0, the switches of device bank 1005 are switched in a pattern (or sequence) that is different than that of device bank 1007. For example, if the bases of subtransistors 1008a-1008d and 1008g of composite transistor 1008 are switched to voltage line $V_1$ and the bases of subtransistors 1008e-1008f are switched to voltage line $V_2$, only the bases of subtransistors 1006a-1006d of composite transistor 1006, which correspond to subtransistors 1008a-1008d, are switched to voltage line $V_1'$. The bases of subtransistors 1006e-1006f of composite transistor 1006, however, are switched to voltage line $V_2'$ because the bases of its corresponding subtransistors 1008e-1008f also are switched to voltage line $V_2$. The base of subtransistor 10069 also is switched to voltage line $V_2'$ because the illustrative logic in decoder 1113 is configured to drive switch 1005g (which is coupled to subtransistor 1006g) in opposition to switch 1007g (which is coupled to subtransistor 1008g) when the LSB input is 1 and the MSB' is 0.

It should be noted that when the MSB' changes to 1, however, the switches of device banks 1005 and 1007 can be switched in the same pattern (or sequence) when the LSB is 0 and in different patterns (or sequences) when the LSB is 1.

The "half-step" that results from driving subtransistors in corresponding composite transistors in opposition to each other (as described above) provides the extra levels of resolution in DAC 1000. By doing so in a split-core DAC, the averaging described above results in resistance values that are closer to a uniform value than without any such averaging.

One of ordinary skill in the art will understand that FIGS. 11A-C present only an illustrative decoding scheme. Other decoding schemes also may be implemented in accordance with the principles of the present invention. For example, each switch in the switching banks can be driven by any one or more bits of the digital input signal in accordance with the principles of the present invention.

While illustrative DAC 1000 of FIGS. 10 and 11A-C drive only one set of corresponding switches in banks 1005 and 1007 in different patterns (or sequences), DAC 1000 also can be configured to drive more than one set of corresponding switches in banks 1005 and 1007 in different patterns (or sequences). Furthermore, DAC 1000 also can be configured to drive one or more set of corresponding switches in banks 1002 and 1004 in different patterns (or sequences) instead of or in addition to corresponding switches in banks 1005 and 1007. When sets of corresponding switches in banks 1002 and 1004 are driven in different patterns (or sequences), the averaging described above may result in resistance values that are closer to a uniform value than without any such averaging. Also, DAC 1000 can be configured so that the LSB drives one or more of the other switches of switching bank 1005.

In an alternative embodiment of the present invention, the interpolators in DAC 1000 can be constructed with the same number of switches in switching banks 1005 and 1007 and the same number of subtransistors in composite transistors 1006, 1008, 1009, 1010 (as compared with DACs 800, 820, and 900). However, by controlling the switching of switch banks 1005 and 1007 in a manner similar to the "half-step" advancement described above, DAC 1000 can offer an extra bit of resolution (as compared to DACs 800, 820, and 900).

Persons skilled in the art will appreciate that, for example, a divide down resistive element may be used in conjunction with DAC 800, 820, 900, or 1000 without departing from the scope of the present invention, and that the present invention is not limited by the specific configurations described herein. For example, although a non-unity gain amplifier 306 with feedback resistors 307 and 308 is shown in FIG. 3 but not in FIG. 8A, the invention is not limited in this manner. Rather, any combination of the above described configurations remain within the scope of the principles of the present invention. Accordingly, for example, one or more gain or attenuation stages may be used in conjunction with DAC 900 shown in FIG. 9 without departing from the scope of the present invention.

Moreover, for the purpose of simplifying the description of the invention, gradient insensitive split-core resistive element and interpolating amplifier DACs have been explained above which use two resistor strings to reduce or eliminate the effects of error gradients. Persons skilled in the art will appreciate, however, that the invention is not limited in this manner. The principles of the present invention also apply to split-core resistive element DACs that include more than two resistor strings, in which case a greater number of voltage taps than described above would be combined for the purpose of at least reducing the effects of error gradients. Using multiple resistor strings configured in any combination that would allow for the reduction or cancellation of error gradients in accordance with the principles of the present invention can be accomplished with minor modification to the DACs shown above. Moreover, although the level of insensitivity to error gradients may not be as high if the error gradients are not nonlinear, as explained above, the invention is not limited to the type of error gradients that are being compensated for.

Persons skilled in the art will also appreciate that although several of the resistive elements described herein are referred to as resistors, the embodiments of the present invention may include not only resistors but also any other suitable type or types of resistive materials without departing from the scope of the present invention. Moreover, various components described above are optional and may be eliminated without departing from the scope of the present invention. For example, divide down resistive element 705 may be removed such that resistor strings 701 and 703 are coupled directly to an available reference voltage Vref. Similarly, while FIGS. 8A-11 both show resistor strings coupled to DACREF, it should be understood by persons skilled in the art that DACs 800, 820, 900, and 1000 may or may not be used in conjunction with a divide down resistive element such as divide down resistive element 705 of FIG. 7. The invention is not limited in this manner.

The above described embodiments of the present invention are presented for purposes of illustration and not of limitation, and the present invention is limited only by the claims which follow.

What is claimed is:

1. A digital to analog converter that produces an analog output voltage indicative of a digital input signal, the digital input signal having a first subword of more significant bits and a second subword of less significant bits, the converter comprising:

a split-core resistive element comprising at least first and second resistive strings configured in such a configuration as to provide the analog output voltage with at least partial insensitivity to error gradients; and an interpolation circuit coupled to the split-core resistive element, said interpolation circuit having at least first and second switching banks and first and second composite transistors, an output of said interpolation circuit used to generate the analog output voltage;

wherein at least a first switch in said first switching bank is configured to couple one or more voltages transmitted from said first resistive string to at least a first subtransistor in said first composite transistor based at least on a least significant bit of the digital input signal; and wherein none of the switches in said second switching bank are configured to couple one or more voltages transmitted from said second resistive string to any of the subtransistors in said second composite transistor based at least on the least significant bit of the digital input signal.

2. The converter of claim 1 wherein at least a second switch in said second switching bank is configured to couple one or more voltages transmitted from said second resistive string to at least a second subtransistor in said second composite transistor based at least on a most significant bit of the second subword.

3. The converter of claim 2 wherein each of the switches in said second switching bank, other than said second switch, is configured to couple one or more voltages transmitted from said second resistive string to one or more of the subtransistors in said second composite transistor, other than said second subtransistor, based at least on a portion of the bits of the digital input signal.

4. The converter of claim 3 wherein each of the switches in said first switching bank, other than said first switch, is configured to couple one or more voltages transmitted from said first resistive string to one or more of the subtransistors in said first composite transistor, other than said first subtransistor, based on the same bit or bits as one of the switches of said second switching bank.

5. The converter of claim 1 further comprising:
third and fourth composite transistors; and
at least one current mirror that couples said first composite transistor to said third composite transistor and that couples said second composite transistor to said fourth composite transistor.

6. The converter of claim 5 further comprising a current source that provides current to said first, second, third, and fourth composite transistors.

7. The converter of claim 5 further comprising:
a first current source that provides current to said first and third composite transistors; and
a second current source that provides current to said second and fourth composite transistors.

8. The converter of claim 1 coupled to a divide down resistive element wherein:
said converter is coupled to a first reference voltage and a second reference voltage;
said divide down resistive element is coupled between a third reference voltage and said converter; and
said divide down resistive element reduces the third reference voltage to produce the first reference voltage.

9. The converter of claim 1 further comprising third and fourth switching banks respectively coupled to said first and second resistive strings, said third switching bank configured to couple voltages from said first resistive string to said interpolation circuit based on the digital input signal, said fourth switching bank configured to couple voltages from said second resistive string to said interpolation circuit based on the digital input signal.

10. The converter of claim 1 further comprising third and fourth switching banks respectively coupled to said first and second resistive strings, said third switching bank configured to couple voltages from said first resistive string to said interpolation circuit based on the first subword, said fourth switching bank configured to couple voltages from said second resistive string to said interpolation circuit based on the first subword.

11. The converter of claim 1 wherein said interpolation circuit is coupled to an amplifier.

12. The converter of claim 11 wherein said amplifier is configured to provide a greater than unity gain.

13. The converter of claim 1 wherein said first and second resistive strings are configured about a common centroid with respect to error gradients.

14. The converter of claim 1 wherein said first and second resistive strings are configured in a one-dimensional configuration.

15. The converter of claim 1 wherein said first and second resistive strings are configured in a multi-dimensional configuration.

16. The converter of claim 1 further comprising a decoder that accepts the digital input signal and outputs decoded digital signals to said interpolation circuit to drive said first and second switching banks.

17. The converter of claim 1, wherein:
each intermediate node of the first resistive string is coupled to at least two switches in the first switching bank; and
each intermediate node of the second resistive string is coupled to at least two switches in the second switching bank.

18. The converter of claim 1, wherein:
each intermediate node of the first resistive string is coupled to one switch in the first switching bank; and
each intermediate node of the second resistive string is coupled to one switch in the second switching bank.

19. A method for producing an analog output voltage indicative of a digital input signal, the digital input signal having a first-subword of more significant bits and a second subword of less significant bits, providing a digital to analog converter having a split-core resistive element having at least first and second resistive strings configured about a common centroid with respect to error gradients and an interpolation circuit coupled to said first and second resistive strings, said interpolation circuit having at least first and second switching banks and first and second composite transistors, the method comprising:
transmitting voltages from said first resistive string to said first switching bank;
transmitting voltages from said second resistive string to said second switching bank;
coupling at least a first subtransistor in said first composite transistor to one or more of the voltages transmitted from said first resistive string based at least on a least significant bit of the digital input signal;
coupling the subtransistors in said second composite transistor to one or more of the voltages transmitted from said second resistive string based on any one or more of the bits of the digital input signal other than the least significant bit; and
generating the analog output voltage from an output of said interpolation circuit.

20. The method of claim 19 further comprising coupling at least a second subtransistor in said second composite transistor to one or more of the voltages transmitted from said second resistive string based at least on a most significant bit of the second subword.

21. The method of claim 20 further comprising coupling one or more of the voltages transmitted from said second resistive string to one or more of the subtransistors in said second composite transistor, other than said second subtransistor, based at least on a portion of the bits of the digital input signal.

22. The method of claim 21 further comprising coupling one or more of the voltages transmitted from said first resistive string to one or more of the subtransistors in said first composite transistor, other than said first subtransistor, based on the same bit or bits as one of the switches of said second switching bank.

23. The method of claim 19 further comprising:
providing a divide down resistive element coupled between a voltage and said converter; and
using said divide down resistive element to reduce the voltage to a reference voltage coupled to said converter.

24. The method of claim 19 further comprising:
providing third and fourth switching banks respectively coupled to said first and second resistive strings;
wherein transmitting voltages from said first resistive string to said first switching bank comprises coupling voltages from said first resistive string to said interpolation circuit based on the digital input signal; and
wherein transmitting voltages from said second resistive string to said second switching bank comprises coupling voltages from said second resistive string to said interpolation circuit based on the digital input signal.

25. The method of claim 24, wherein:
coupling voltages from said first resistive string to said interpolation circuit comprises coupling voltages from said first resistive string to said interpolation circuit based on one or more bits from the first subword; and
coupling voltages from said second resistive string to said interpolation circuit comprises coupling voltages from said second resistive string to said interpolation circuit based on the same one or more bits from the first subword.

26. The method of claim 19 further comprising decoding the digital input signal to produce decoded digital signals that are transmitted to said first and second switching banks.

27. A digital to analog converter that produces an analog output signal indicative of a digital input signal having a first subword of more significant bits and a second subword of less significant bits, the converter comprising:
a split-core resistive element comprising at least first and second resistive strings configured to provide the analog output signal with at least partial insensitivity to error gradients; and
an interpolation circuit coupled to the split-core resistive element, said interpolation circuit having at least first and second switching banks and first and second composite transistors, an output of said interpolation circuit used to generate the analog output signal;
wherein at least a first switch in said first switching banks is configured to couple one or more signals transmitted from said first resistive string to at least a first subtransistor in said first composite transistor based at least on one bit of said second subword;
wherein at least a second switch in said second switching bank is configured to couple one or more signal transmitted from said second resistive string to at least a second subtransistor in said second composite transistor based at least on one different bit of said second subword; and
wherein said first subtransistor and said second subtransistor have equivalent weights with respect to said first composite transistor and second composite transistor, respectively.

28. The converter of claim 27, wherein a selection of said at least one bit of said second subword and the at least one different bit of said second subword changes over time to improve a time averaged error of the analog output signal.

29. The converter of claim 27, wherein:
each intermediate node of the first resistive string is coupled to at least two switches in the first switching bank; and
each intermediate node of the second resistive string is coupled to at least two switches in the second switching bank.

30. The converter of claim 27, wherein:
each intermediate node of the first resistive string is coupled to one switch in the first switching bank; and
each intermediate node of the second resistive string is coupled to one switch in the second switching bank.

31. A method for producing an analog output signal indicative of a digital input signal, the digital input signal comprising a first subword of more significant bits and a second subword of less significant bits, the method comprising:
using a split-core resistive element comprising at least first and second resistive strings to provide a signal having at least partial resistivity to error gradients; and
generating the analog output signal based at least in part on the signal having at least partial resistivity to error gradients, the generating using an output of an interpolation circuit coupled to the split-core resistive element, said interpolation circuit having at least first and second switching banks and first and second composite transistors;
configuring at least a first switch in said first switching bank to couple one or more signals transmitted from said first resistive string to at least a first subtransistor in said first composite transistor based at least on one bit of said second subword;
configuring at least a second switch in said second switching bank to couple one or more signals transmitted from said second resistive string to at least a second subtransistor in said second composite transistor based at least on one different bit of said second subword; and
weighting said first and second subtransistors substantially equally with respect to said first composite transistor and said second composite transistor, respectively.

32. The method of claim 31, further comprising changing a selection of said at least one bit of said second subword and a selection of said at least one different bit of said second subword to improve a time averaged error of the analog output signal.

* * * * *